(12) United States Patent
Teo et al.

(10) Patent No.: US 10,629,752 B1
(45) Date of Patent: Apr. 21, 2020

(54) GATE ALL-AROUND DEVICE

(71) Applicant: Applied Materials, Inc., Santa Clara, CA (US)

(72) Inventors: Russell Chin Yee Teo, San Jose, CA (US); Benjamin Colombeau, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/157,337

(22) Filed: Oct. 11, 2018

(51) Int. Cl.
*H01L 29/78* (2006.01)
*H01L 29/06* (2006.01)
*H01L 29/423* (2006.01)
*H01L 29/49* (2006.01)
*H01L 29/66* (2006.01)
*H01L 27/06* (2006.01)
*H01L 29/786* (2006.01)
*H01L 21/02* (2006.01)
*H01L 21/28* (2006.01)
*H01L 21/822* (2006.01)

(52) U.S. Cl.
CPC .. *H01L 29/78696* (2013.01); *H01L 21/02603* (2013.01); *H01L 21/02639* (2013.01); *H01L 21/28088* (2013.01); *H01L 21/8221* (2013.01); *H01L 27/0688* (2013.01); *H01L 29/0676* (2013.01); *H01L 29/42392* (2013.01); *H01L 29/4908* (2013.01); *H01L 29/66545* (2013.01); *H01L 29/66742* (2013.01)

(58) Field of Classification Search
CPC ........... H01L 29/78696; H01L 29/0676; H01L 29/42392; H01L 29/4908; H01L 29/66545; H01L 29/66742; H01L 27/0688
See application file for complete search history.

(56) References Cited

U.S. PATENT DOCUMENTS

| 4,087,795 A | * | 5/1978 | Rossler | G11C 11/34 257/321 |
| 4,916,504 A | * | 4/1990 | Nakahara | H01L 27/0688 257/69 |
| 5,406,094 A | * | 4/1995 | Arimoto | B82Y 10/00 257/12 |

(Continued)

FOREIGN PATENT DOCUMENTS

| KR | 20100110853 A | 10/2010 |
| KR | 20170067234 A | 6/2017 |

OTHER PUBLICATIONS

Kongetira, Poonacha P., et al., "Modeleng of Growth Rates of Selecteve Epitaxial Growth (SEG) and Epitaxial Lateral Overgrowth (ELO) of Silicon in the SiH2Cl2—HClH2 System", Purdue University e-Pubs, Oct. 1, 1994, 1-67.

(Continued)

*Primary Examiner* — Ida M Soward
(74) *Attorney, Agent, or Firm* — Servilla Whitney LLC

(57) ABSTRACT

Gate all-around devices are disclosed in which an angled channel including a semiconducting nanostructure is located between a source and a drain. The angled channel has an axis that is oriented at an angle to the top surface of the substrate at an angle in a range of about 1° to less than about 90°. The gate all-around device is intended to meet design and performance criteria for the 7 nm technology generation.

14 Claims, 20 Drawing Sheets

(56) References Cited

U.S. PATENT DOCUMENTS

| | | | |
|---|---|---|---|
| 5,535,028 A * | 7/1996 | Bae | H01L 27/124 |
| | | | 349/145 |
| 6,342,716 B1 * | 1/2002 | Morita | B82Y 10/00 |
| | | | 257/315 |
| 7,642,124 B2 * | 1/2010 | Dimmler | H01L 51/0022 |
| | | | 257/40 |
| 8,188,445 B2 | 3/2012 | Godet et al. | |
| 8,536,029 B1 | 9/2013 | Chang et al. | |
| 8,623,171 B2 | 1/2014 | Godet et al. | |
| 8,630,117 B2 * | 1/2014 | Horch | H01L 27/11519 |
| | | | 365/185.15 |
| 8,754,482 B2 * | 6/2014 | Yin | H01L 21/26506 |
| | | | 257/374 |
| 9,153,592 B2 * | 10/2015 | Ogura | H01L 27/11565 |
| 9,190,498 B2 | 11/2015 | Brand et al. | |
| 9,385,195 B1 | 7/2016 | Zhang | |
| 9,502,518 B2 | 11/2016 | Liu et al. | |
| 9,502,550 B2 * | 11/2016 | Padmanabhan | H01L 29/7787 |
| 9,634,092 B2 * | 4/2017 | Bhuwalka | H01L 29/0673 |
| 9,748,252 B2 * | 8/2017 | Hafez | H01L 27/11206 |
| 9,893,176 B2 * | 2/2018 | Konstantinov | H01L 29/7803 |
| 9,953,983 B2 | 4/2018 | Zhang | |
| 10,090,406 B2 * | 10/2018 | Prechtl | H01L 29/0688 |
| 10,164,092 B2 * | 12/2018 | Balakrishnan | H01L 29/7827 |
| 10,243,074 B2 * | 3/2019 | Liu | H01L 29/7827 |
| 10,276,667 B1 * | 4/2019 | Atanackovic | H01L 29/1608 |
| 2003/0102508 A1 * | 6/2003 | Lee | H01L 27/1285 |
| | | | 257/359 |
| 2004/0188755 A1 * | 9/2004 | Tarui | H01L 21/0465 |
| | | | 257/328 |
| 2011/0291190 A1 | 12/2011 | Xiao et al. | |
| 2012/0258600 A1 | 10/2012 | Godet et al. | |
| 2013/0306935 A1 | 11/2013 | Chang et al. | |
| 2014/0034611 A1 | 2/2014 | Godet et al. | |
| 2015/0325411 A1 | 9/2015 | Godet | |
| 2016/0111513 A1 | 4/2016 | Liu et al. | |
| 2016/0190312 A1 | 6/2016 | Zhang et al. | |

OTHER PUBLICATIONS

Kataria, Himanshu, et al., "Speeding Up Silicon With Infrared Lasers", Silicon Semiconductor Magazine, Oct. 3, 2014.
PCT International Search Report and Written Opinion in PCT/US2019/054938 dated Jan. 29, 2020, 10 pages.

* cited by examiner

GATE ALL-AROUND DEVICE

TECHNICAL FIELD

Embodiments of the present disclosure pertain to the field of electronic device manufacturing, and in particular, to transistors. More particularly, embodiments of the disclosure are directed to gate all-around transistor devices and methods of manufacturing gate all-around transistor devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. One particularly far-reaching technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin so as to influence current flow from three surfaces instead of one. The improved control achieved with a 3-D design results in faster switching performance and reduced current leakage. Building taller devices has also permitted increasing the device density within the same footprint that had previously been occupied by a planar FET.

The FinFET concept was extended by development of a gate all-around FET (GAA FET), in which the gate fully wraps around the channel for maximum control of the current flow therein. In the GAA FET, the channel can take the form of a cylindrical nanowire that is isolated from the substrate. Existing GAA FETs are oriented horizontally, such that the nanowire extends in a direction that is parallel to the surface of the semiconductor substrate.

The FinFET concept was further extended by development of a vertical gate all-around FET (vGAA FET), in which a current-carrying nanowire is oriented perpendicular to the surface of the semiconductor substrate. In terms of scaling, however, the amount of area used in a vGAA FET is prohibitive. Additionally, neither GAA nor vGAA eliminate current leakage. Thus, there is a need for gate all-around FETs that have improved performance for transistors having critical dimensions below 7 nm.

SUMMARY

One or more embodiments are directed to electronic devices and methods of manufacturing electronic devices. In one or more embodiments, a transistor comprises a substrate having a top surface; a source region having a source and a source contact, the source region on the top surface of the substrate; a drain region having a drain and a drain contact, the drain region on the top surface of the substrate; an angled channel located between the source and the drain and having an axis that is oriented at an angle relative to the top surface of the substrate in a range of greater than about 1° to less than about 90°; a gate enclosing the angled channel between the source region and the drain region; and a dielectric layer overlying and in contact with one or more of the gate, the source contact, or the drain contact.

In one or more embodiments, a method of manufacturing a transistor comprises forming a dielectric layer on a top surface of a substrate. An angled opening is formed in the dielectric layer, the angled opening having an axis oriented relative to the top surface of the substrate at an angle in a range of greater than about 1° to less than about 90°. An angled channel is formed in the angled opening. An opening is formed from a top surface of the dielectric layer to the top surface of the substrate, the opening formed substantially orthogonal to the top surface of the substrate, the opening exposing a portion of the dielectric layer enclosing the angled channel. A dummy gate is deposited in the opening. A drain portion of the angled channel is exposed in a drain region on a first side of the dummy gate. A first contact metal is deposited in the drain region to form a drain contact. A source portion of the angled channel is exposed in a source region on a second side of the dummy gate different than the first side. A second contact metal is deposited in the source region to form a source contact. The dummy gate is replaced with a gate metal.

In one or more embodiments, a transistor comprises a substrate comprising a doped epitaxial layer having a laser treated top surface; a source region having a source and a source contact, the source region on the top surface of the substrate; a drain region having a drain and a drain contact, the drain region on the top surface of the substrate; an angled channel comprising a semiconducting nanostructure located between the source and the drain and having an axis that is oriented at an angle to the top surface of the substrate at an angle in a range selected from the group consisting of about 1° to less than about 90°, about 10° to about 80°, about 20° to about 70°, and about 33° to about 67°; a gate oxide and a high-K dielectric layer on the angled channel; at least one work-function metal on the gate oxide; a gate metal on the work-function metal; and a dielectric layer overlying and in contact with one or more of the gate, the source contact or the drain contact.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
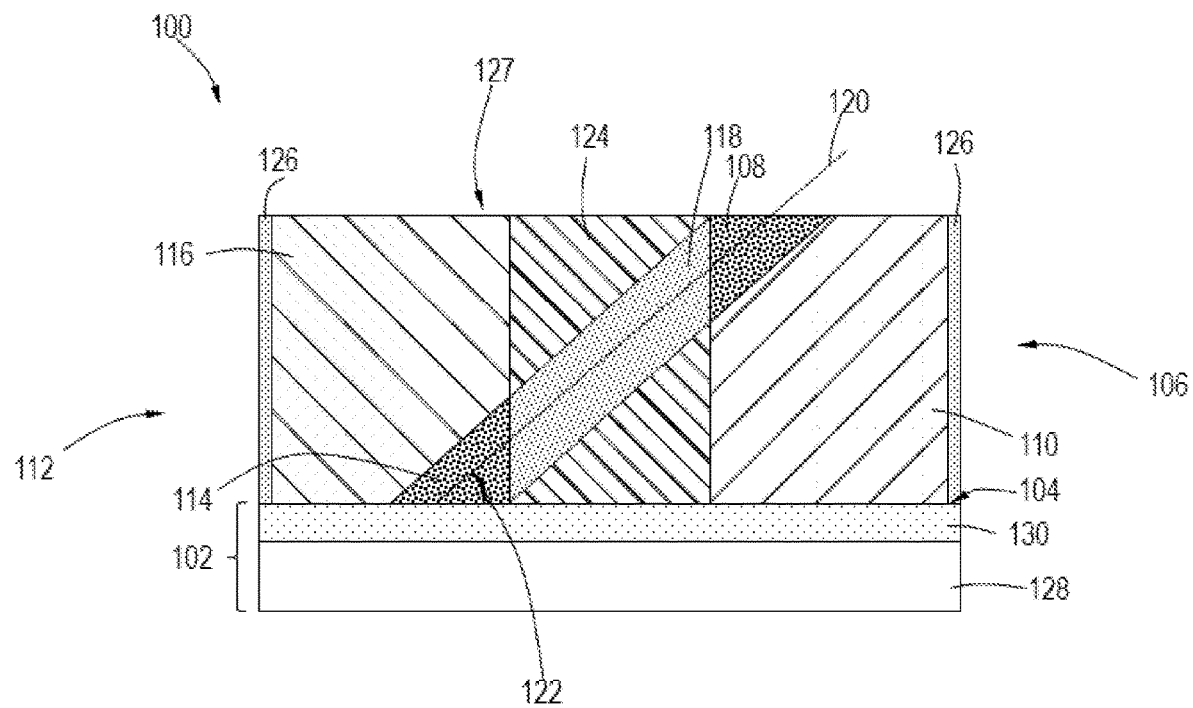
FIG. 1 illustrates a cross-section view of a device according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA) FETs," sometimes called the lateral nanowire FET, is used to refer to a FinFET in which the gate material surrounds the channel region on all sides. In one or more embodiments, GAA transistors provide better electrostatics than FinFETs, allowing for additional gate length scaling. Depending on design, gate all-around FETs can have two or four effective gates.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g. DRAM) and non-volatile (e.g. NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g. transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure provide electronic devices and processing for forming said electronic devices. The electronic devices of one of more embodiments advantageously use less area than GAA and vGAA. Additionally, the electronic devices of one or more embodiments advantageously reduce current leakage improved drive current, reduce capacitance, and allow vertical scaling.

Figure 2:
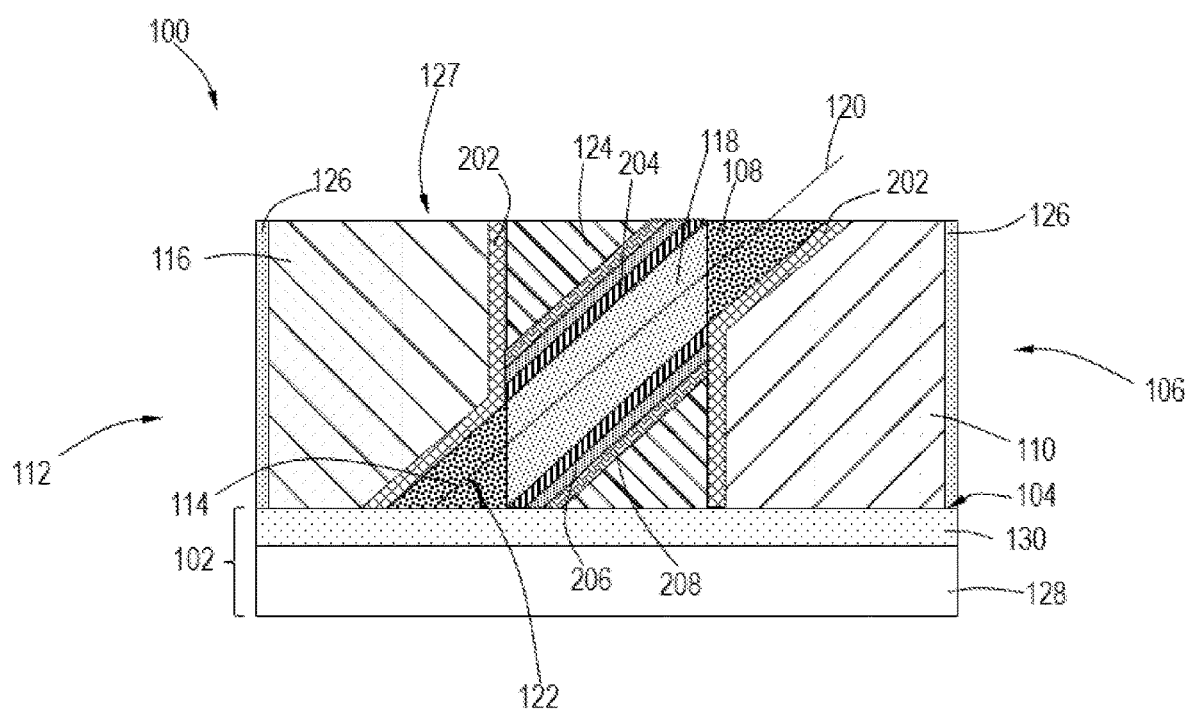
FIG. 2 illustrates a cross-section view of a device according to one or more embodiments of the disclosure.

The electronic device 100 of one or more embodiments can be referred to as a transistor, a transistor gate, a logic device, and the like. The individual components of the electronic device 100, including the semiconductor substrate 102, the source 108, the source contact 110, the drain 114, the drain contact 116, the angled channel 118, the gate 124, and the dielectric layer 126 can be formed by any suitable process or processes known to the skilled artisan. FIGS. 1-2 illustrate an electronic device (e.g. a transistor) according to one or more embodiments of the disclosure. FIGS. 3-31 illustrate an electronic device (e.g. a transistor) and a method of manufacturing a transistor according to one or more embodiments of the disclosure.

FIGS. 1 and 2 are cross-section views of an electronic device (e.g. a transistor) 100 according to one or more embodiments. With reference to FIG. 1, a electronic device 100 comprises a semiconductor substrate 102 having a top surface 104. The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 102 comprises a p-well or n-well epitaxial layer 128 and a laser repaired surface 130. As used herein, the term "epitaxial" refers to the deposition of a crystalline overlayer on a crystalline substrate. The crystalline overlayer is called an epitaxial layer. Epitaxial layers can be grown from gaseous or liquid precursors. In one or more embodiments, the semiconductor substrate 102 acts as a seed crystal, so the deposited epitaxial layer locks into one or more crystallographic orientations with respect to the substrate crystal.

In one or more embodiments, the epitaxial layer is produced by pre-implantation of dopants to define p-well or n-well and produce a p-well or n-well epitaxial layer 128. In one or more embodiments, the semiconductor substrate 102 is doped with an electron acceptor element. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

In one or more embodiments, the a p-well or n-well epitaxial layer 128 is laser repaired and treated to improve electron mobility, forming a laser repaired surface 130. As will be appreciated by one of skill in the art, without intending to be bound by theory, the purpose of the laser repair is to convert the top surface 104 of the substrate into a smooth, glass-like surface. In one or more embodiments, the laser repair is critical because the laser repaired surface 130 of the a p-well or n-well epitaxial layer 128 of the semiconductor substrate 102 will act as seed for epitaxial growth.

With reference to FIG. 1, a source region 106 is on the top surface 104 of the semiconductor substrate 102. The source region 106 has a source 108 and a source contact 110. A drain region 112 is on the top surface 104 of the semiconductor substrate 102 opposite the source region 106. The drain region 112 has a drain 114 and a drain contact 116.

In one or more embodiments, an angled channel 118 is located between the source 108 and the drain 114. The angled channel 118 has an axis 120 that is oriented at an angle 122 relative to the top surface 104 of the semiconductor substrate 102. The angle 122 is in a range of greater than about 1° to less than about 90°.

As used herein, the term "stackable angled logic (SAL)" refers to the electronic device 100, specifically the gate all-around (GAA) logic device, of one or more embodiments. The logic device comprises an angled channel 118 located between a source 108 and a drain 114, the angled channel 118 having an axis 120 that is oriented relative to the top surface 104 of the semiconductor substrate 102 at an angle 122 in a range of greater than about 1° to less than about 90°.

As used herein, the term "axis" refers to a line dividing an object. In one or more embodiments, the axis 120 is oriented relative to a top surface 104 of the semiconductor substrate 102 such that if the axis were parallel to the top surface 104 of the substrate, the axis 120 would have an angle 122 of 0°. If the axis 120 were oriented perpendicular to the top surface 104 of the semiconductor substrate 102, the axis 120 would have an angle 122 of 90°. As will be appreciated by the skilled artisan, a gate all-around (GAA) transistor (or a horizontal gate all-around (hGAA) transistor) has an axis that has an angle of 0°, and a vertical gate all-around (vGAA) transistor has an axis that has an angle of 90° (i.e. perpendicular or transverse to the top surface of the substrate).

In one or more embodiments, the angled channel 118 has an axis 120 that is oriented relative to the top surface 104 of the semiconductor substrate 102 at an angle 122 of greater than about 1° to less than about 90°, including an angle 122 of about 10° to about 80°, an angle 122 of about 20° to about 70°, or an angle 122 about 33° to about 67°. In one or more embodiments, the axis 120 of the angled channel 118 is oriented relative to the top surface 104 of the semiconductor substrate 102 at an angle 122 in a range selected from the group consisting of greater than about 1° to less than about 90°, about 10° to about 80°, about 20° to about 70°, and about 33° to about 67°. In other embodiments, the angled channel 118 has an axis 120 that is oriented relative to the top surface 104 of the semiconductor substrate 102 at an angle 122 of greater than about 1° to less than about 90°, including about 5°, about 10°, about 15°, about 20°, about 25°, about 30°, about 35°, about 40°, about 45°, about 50°, about 55°, about 60°, about 65°, about 70°, about 75°, about 80°, or about 85°. In a specific embodiment, the angled channel 118 has an axis 120 that is oriented at an angle 122 of about 47°. In another specific embodiment, the angled channel 118 has an axis 120 that is oriented at an angle 122 of about 55°. In a further specific embodiment, the angled channel 118 has an axis 120 that is oriented at angle 122 of about 67°.

Referring to FIG. 1, there is a gate 124 enclosing the angled channel 118 between the source region 106 and the drain region 112.

In one or more embodiments, a dielectric layer 126 overlies and is in contact with one or more of the gate 124, the source contact 110, or the drain contact 116. In one or more embodiments, the dielectric layer 126 is any low-K dielectric material known to one of skill in the art. In one or more embodiments, the dielectric layer 126 comprises a low-K dielectric material with atoms of one or more of silicon, aluminum, carbon, oxygen, hydrogen, or nitrogen. For example, the dielectric layer 126 comprises one or more of silicon oxide, silicon oxycarbide, silicon oxynitride, SiCOH, SiCONH, aluminum oxide, and the like. While the term "silicon oxide" may be used to describe the dielectric layer 126, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like. In one or more embodiments, the dielectric layer 126 is planarized, etched, or polished such that the dielectric layer 126 is not on a top surface 127 of the electronic device 100. As used herein, the term "planarized" refers to a process of smoothing surfaces and includes, but is not limited to, chemical mechanical polishing/planarization (CMP), etching, and the like.

In one or more embodiments, the angled channel 118 comprises a semiconducting nanowire, a semiconducting nanosheet, or a gate all-around. In one or more embodiments, the semiconducting nanowire and/or the semiconducting nanosheet is an epitaxially grown nanowire and/or an epitaxially grown nanosheet.

FIG. 2 is a cross-section view of an electronic device 100 according to one or more embodiments of the present disclosure. With reference to FIG. 2, in one or more embodiments the electronic device 100 further comprises a barrier layer 202 between the gate 124 and one or more of the source contact 110 or the drain contact 116. In one or more embodiments, the barrier layer 202 is any barrier layer material known to one of skill in the art. For example, in one or more embodiments, the barrier layer 202 comprises one or more of cobalt (Co), manganese (Mn), molybdenum (Mo), titanium nitride (TiN), titanium (Ti), tungsten carbide (WC), and the like.

In some embodiments, the electronic device 100 further comprises a gate oxide 204 enclosing the angled channel 118. The gate oxide 204 can be any suitable material known to the skilled artisan. The gate oxide 204 can be deposited using one or more deposition techniques known to one of ordinary skill in the art of microelectronic device manufacturing. In one or more embodiments, gate oxide 204 is deposited using one of deposition techniques, such as, but not limited to, ALD, CVD, PVD, MBE, MOCVD, spin-on, or other insulating layer deposition techniques known to the skilled artisan. In one or more embodiments, gate oxide 204 comprises a low-K dielectric. In some embodiments, the low-K dielectric is selected from one or more of silicon, silicon oxide, silicon nitride, silicon oxynitride, silicon oxycarbide, silicon oxycarbonitride, doped silicon, doped silicon oxide, doped silicon nitride, doped silicon oxynitride, spin-on dielectrics, or a diffusion species growth. In one or more embodiments, gate oxide 204 comprises a silicon oxide.

In some embodiments, the transistor further comprises a high-K dielectric layer 206 on the gate oxide 204 (or mixed with the gate oxide 204) between the angled channel 118 and the gate 124. The high-K dielectric layer 206 can be any suitable high-K dielectric material known to the skilled artisan. In one or more embodiments, the high-K dielectric layer 206 comprises hafnium oxide or a lanthanum (La) doped high-K dielectric.

In some embodiments, the electronic device 100 further comprises at least one work-function metal 208 on the high-K dielectric layer 206 and the gate oxide 204 between the angled channel 118 and the gate 124. In one or more embodiments, the at least one work-function metal 208 comprises one or more of aluminum (Al), aluminum carbide (AlC), aluminum titanium carbide (AlTiC), titanium oxynitride (TiON), titanium aluminum carbochloride (TiAlCCl), titanium aluminum carbofluoride (TiAlCF), titanium aluminum carbooxychlorofluoride (TiAlCOClF), titanium aluminum carbooxyfluorchloride (TiAlCOFCl), titanium aluminum carbide (TiAlC), tantalum (Ta), tungsten (W), titanium carbide (TiC), titanium nitride (TiN), tantalum nitride (TaN), or titanium aluminum nitride (TiAlN).

One or more embodiments of the disclosure provide methods forming electronic devices, particularly methods for forming stackable angled logic (SAL) devices. FIGS. 3-31 illustrate the method of one or more embodiments of the disclosure.

Figure 3:
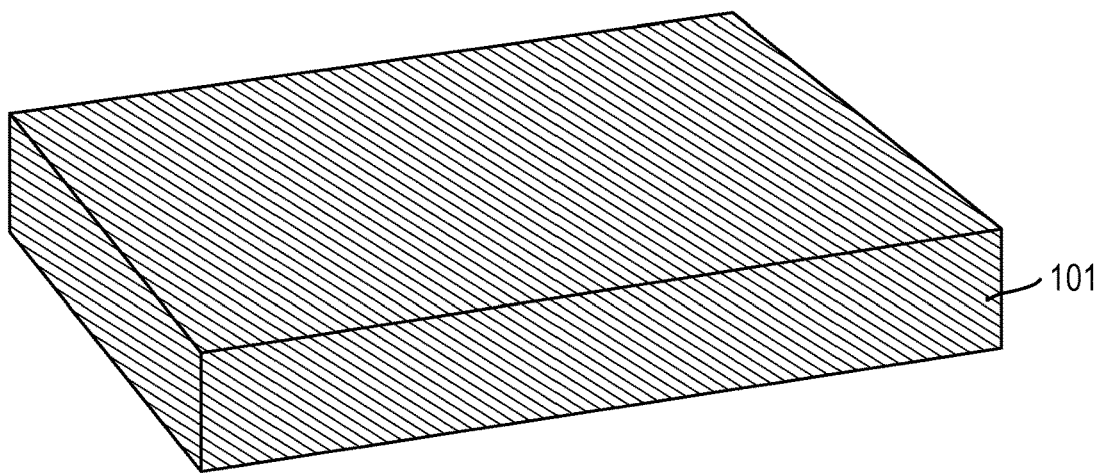
FIG. 3 illustrates a perspective view of a device according to one or more embodiments of the disclosure.

FIGS. 3-31 are perspective and parallel projection views depicting an electronic device (e.g. a transistor) and a method of manufacturing an electronic device according to one or more embodiments of the disclosure. With reference to FIG. 3, a substrate 101 is provided. As used in this specification and the appended claims, the term "provided" means that the substrate 101 is made available for processing (e.g., positioned in a processing chamber). In one or more embodiments, the substrate 101 comprises carbon, glass, or an epitaxially grown material selected from one or more of silicon, indium phosphate, germanium, silicon germanium, gallium arsenide, and the like.

Figure 4:
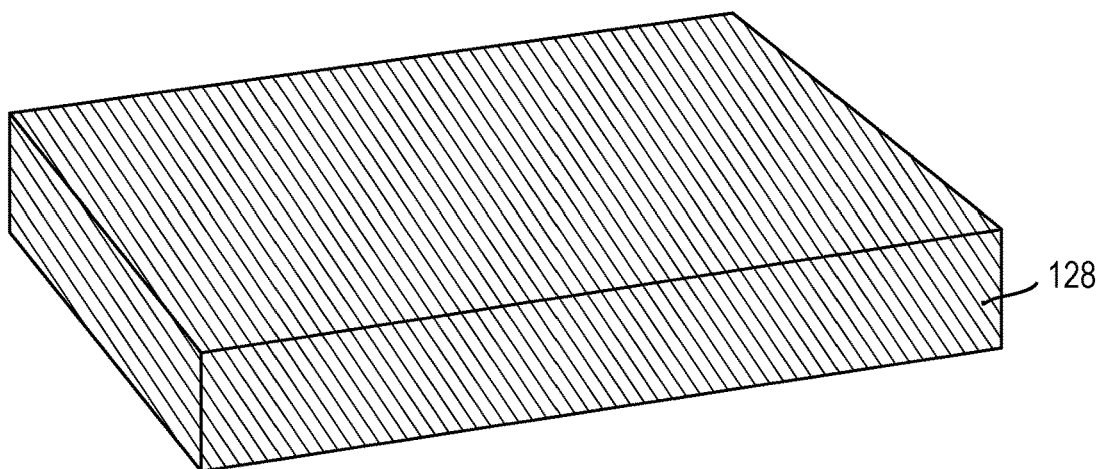
FIG. 4 illustrates a perspective view of a device according to one or more embodiments of the disclosure.

With reference to FIG. 4, in one or more embodiments, dopants are pre-implanted into the substrate 101 to define a p-well or n-well epitaxial layer 128. The addition of a dopant to substrate 101, known as doping, has the effect of shifting the Fermi levels within the material. This results in a material with predominantly negative (n-type) or positive (p-type) charge carriers depending on the dopant variety. In one or more embodiments, dopants are introduced into the substrate 101 by a variety of techniques including, but not limited to, solid sources, gases, spin on liquid, ion implanting, and the like. In one or more embodiments, the dopant is selected from one or more of boron (B), arsenic (As), phosphorous (P), antimony (Sb), aluminum (Al), gallium (Ga), selenium (Se), tellurium (Te), magnesium (Mg), zinc (Zn), cadmium (Cd), silicon (Si), germanium (Ge), and the like.

Figure 5:
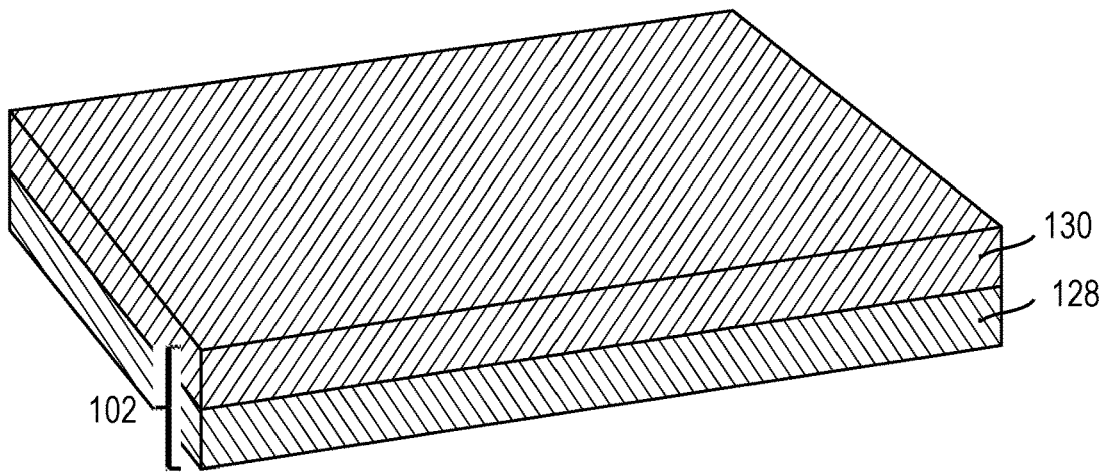
FIG. 5 illustrates a perspective view of a device according to one or more embodiments of the disclosure.

With reference to FIG. 5, in one or more embodiments, the p-well or n-well epitaxial layer 128 is laser repaired and/or treated to improve electron mobility and provide a laser repaired surface 130 on the p-well or n-well epitaxial layer 128. As will be appreciated by one of skill in the art, without intending to be bound by theory, the purpose of the laser repair is to convert the top surface 104 of the semiconductor substrate 102 into a smooth, glass-like surface. In one or more embodiments, the laser repair is critical because the laser repaired surface 130 of the p-well or n-well epitaxial layer 128 will act as seed for epitaxial growth. The p-well or n-well epitaxial layer 128 and the laser repaired surface 130 define the semiconductor substrate 102.

Figure 6:
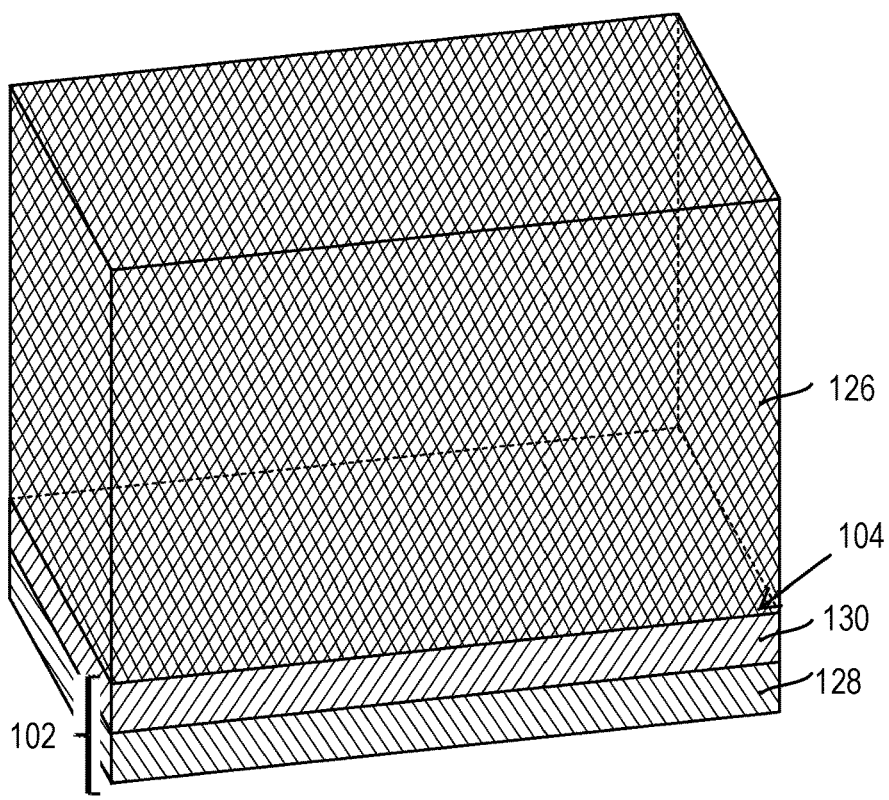
FIG. 6 illustrates a parallel projection view of a device according to one or more embodiments of the disclosure.

With reference to FIG. 6, a dielectric layer 126 is deposited on the laser repaired surface 130 on a top surface 104 of the semiconductor substrate 102. In one or more embodiments, the dielectric layer 126 is any low-K dielectric material known to one of skill in the art. In one or more embodiments, the dielectric layer 126 comprises a low-K dielectric material with atoms of one or more of silicon, aluminum, carbon, oxygen, hydrogen, or nitrogen. For example, in one or more embodiments, the dielectric layer 126 comprises one or more of silicon oxide, silicon oxycarbide, silicon oxynitride, SiCOH, SiCONH, aluminum oxide, and the like. In one or more embodiments, the dielectric layer 126 comprises a number of different films, for example from about 2 to about 10 films, including about 3 to about 7 films, of an oxide low-K dielectric material stacked on top of each other. Each film has a thickness in the range of about 5 nm to about 20 nm, such that the thickness of the dielectric layer 126 is in a range of about 10 nm to about 200 nm.

Figure 7:
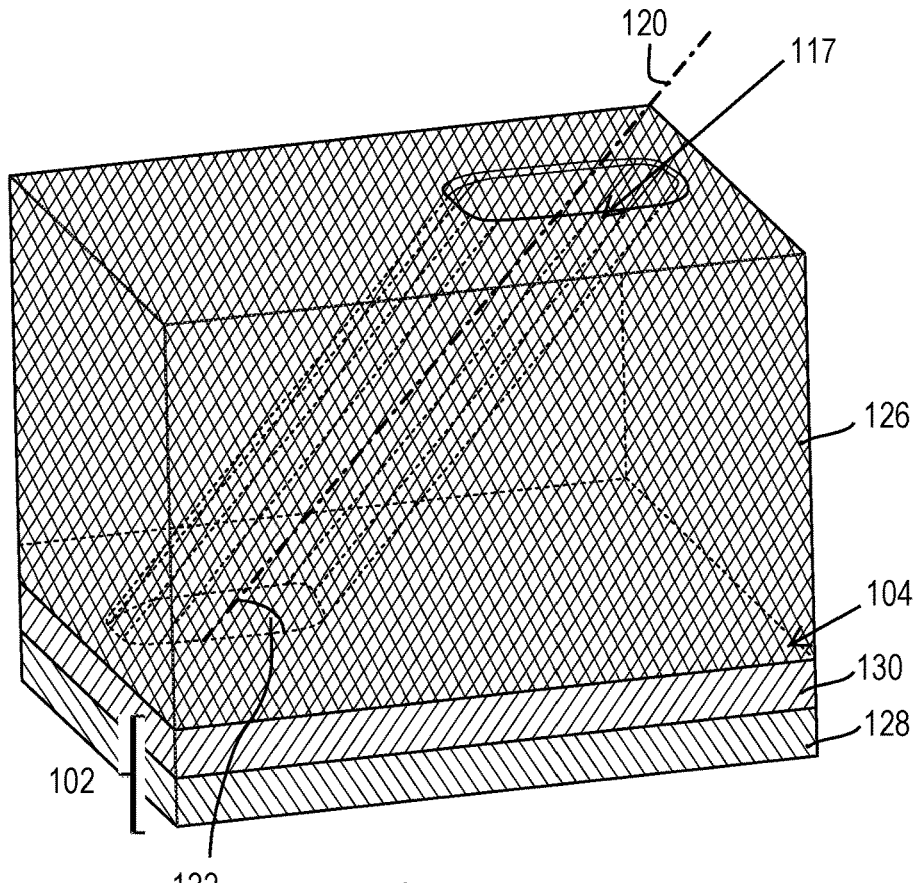
FIG. 7 illustrates a perspective view of a device according to one or more embodiments of the disclosure.

Referring to FIG. 7, in one or more embodiments, an angled opening 117 is formed in the dielectric layer 126. The angled opening 117 has an axis 120 that is oriented at an angle 122 relative to the top surface 104 of the semiconductor substrate 102. The angle 122 is in a range of greater than about 1° to less than about 90°. In one or more embodiments, the angled opening 117 has an elliptical shape. In other embodiments, the angled opening 117 has an un-elliptical shape. In one or more embodiments, the angled opening 117 has a size in the range of about 0.1 nm to about 1000 nm, including about 0.1 nm, about 1 nm, about 10 nm, about 25 nm, about 50 nm, about 100 nm, about 200 nm, about 300 nm, about 400 nm, about 500 nm, about 600 nm, about 700 nm, about 800 nm, about 900 nm, and about 1000 nm. In one or more embodiments, the angled opening 117 has an un-elliptical shape, and the ratio of non-circularity is in a range of about 0.1 to about 99. In other embodiments, the angled opening 117 is square or rectangular in shape. In still further embodiments, the angled opening 117 is sheet-like in shape. In one or more embodiments, multiple angled opening(s) 117 are patterned and etched in tandem.

In one or more embodiments, the axis 120 is oriented relative to a top surface 104 of the semiconductor substrate 102 such that if the axis were parallel to the top surface 104 of the substrate, the axis 120 would have an angle 122 of 0°. If the axis 120 were oriented perpendicular to the top surface 104 of the semiconductor substrate 102, the axis 120 would have an angle 122 of 90°.

In one or more embodiments, the angled opening 117 has an axis 120 that is oriented relative to the top surface 104 of the semiconductor substrate 102 at an angle 122 of greater than about 1° to less than about 90°, including an angle 122 of about 10° to about 80°, an angle 122 of about 20° to about 70°, or an angle 122 about 33° to about 67°. In one or more embodiments, the axis 120 of the angled opening 117 is oriented relative to the top surface 104 of the semiconductor substrate 102 at an angle 122 in a range selected from the group consisting of greater than about 1° to less than about 90°, about 10° to about 80°, about 20° to about 70°, and about 33° to about 67°. In other embodiments, the angled opening 117 has an axis 120 that is oriented relative to the top surface 104 of the semiconductor substrate 102 at an angle 122 of greater than about 1° to less than about 90°, including about 5°, about 10°, about 15°, about 20°, about 25°, about 30°, about 35°, about 40°, about 45°, about 50°, about 55°, about 60°, about 65°, about 70°, about 75°, about 80°, or about 85°. In a specific embodiment, the angled opening 117 has an axis 120 that is oriented at an angle 122 of about 47°. In another specific embodiment, the angled opening 117 has an axis 120 that is oriented at an angle 122 of about 55°. In a further specific embodiment, the angled opening 117 has an axis 120 that is oriented at angle 122 of about 67°.

In one or more embodiments, the angled opening 117 is formed by etching the dielectric layer 126. In one or more embodiments, the angled opening 117 is formed using directional ion beam etching using an altered plasma sheath to allow ions from angled etching to impact the workpiece and specified angles from about 1° to less than about 90° to create the angled opening 117. It is noted that the angled opening 117 does not create an opening in the laser repaired surface 130 or the p-well or n-well epitaxial layer 128 of the semiconductor substrate 102. In one or more embodiments, an optional etch stop layer (not illustrated) is deposited on the top surface 104 of the semiconductor substrate 102 on the laser repaired surface 130.

Figure 8A:
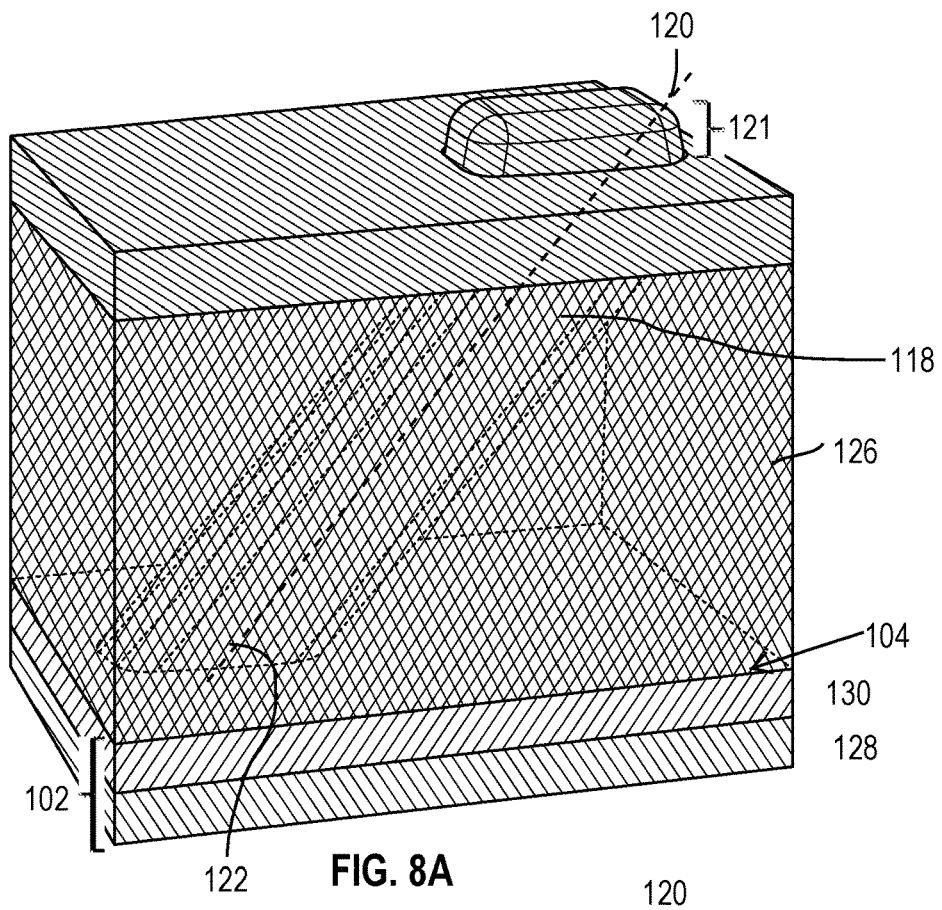
FIG. 8A illustrates a perspective view of a device according to one or more embodiments of the disclosure.
Figure 8B:
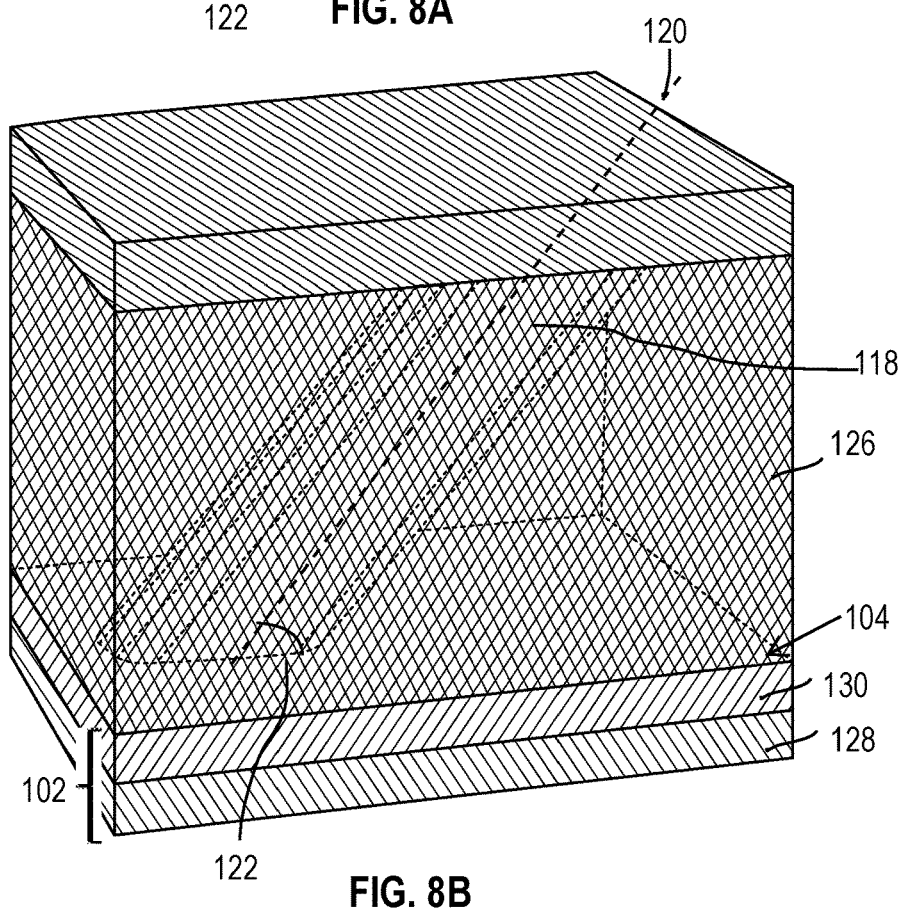
FIG. 8B illustrates a perspective view of a device according to one or more embodiments of the disclosure.

With reference to FIGS. 8A and 8B, an angled channel 118 is formed in the angled opening 17. Following the contours of the angled opening 117, the angled channel 118 likewise has an axis 120 that is oriented at an angle 122 relative to the top surface 104 of the semiconductor substrate 102. The angle 122 is in a range of greater than about 1° to less than about 90°.

In one or more embodiments, the angled channel 118 has an axis 120 that is oriented relative to the top surface 104 of the semiconductor substrate 102 at an angle 122 of greater than about 1° to less than about 90°, including an angle 122 of about 10° to about 80°, an angle 122 of about 20° to about 70°, or an angle 122 about 33° to about 67°. In one or more embodiments, the axis 120 of the angled channel 118 is oriented relative to the top surface 104 of the semiconductor substrate 102 at an angle 122 in a range selected from the group consisting of greater than about 1° to less than about 90°, about 10° to about 80°, about 20° to about 70°, and about 33° to about 67°. In other embodiments, the angled channel 118 has an axis 120 that is oriented relative to the top surface 104 of the semiconductor substrate 102 at an angle 122 of greater than about 1° to less than about 90°, including about 5°, about 10°, about 15°, about 20°, about 25°, about 30°, about 35°, about 40°, about 45°, about 50°, about 55°, about 60°, about 65°, about 70°, about 75°, about 80°, or about 85°. In a specific embodiment, the angled channel 118 has an axis 120 that is oriented at an angle 122 of about 47°. In another specific embodiment, the angled channel 118 has an axis 120 that is oriented at an angle 122 of about 55°. In a further specific embodiment, the angled channel 118 has an axis 120 that is oriented at angle 122 of about 67°.

In one or more embodiments, the angled channel 118 comprises a semiconducting nanostructure (e.g. semiconducting nanowire, a semiconducting nanosheet, a semiconducting carbon nanotube, or the like), or a gate all-around. In one or more embodiments, the semiconducting nanowire and/or the semiconducting nanosheet and/or the semiconducting carbon nanotube is an epitaxially grown nanowire and/or an epitaxially grown nanosheet and/or an epitaxially grown nanotube.

In one or more embodiments, the angled channel 118 comprises an epitaxially grown material selected from one or more of silicon, indium phosphate, germanium, silicon germanium, gallium arsenide, and the like. Referring to FIGS. 8A-8B, in one or more embodiments, the angled channel 188 is formed with an overburden 121, which may be removed by any planarization, etching, or polishing technique known to one of skill in the art.

Figure 9:
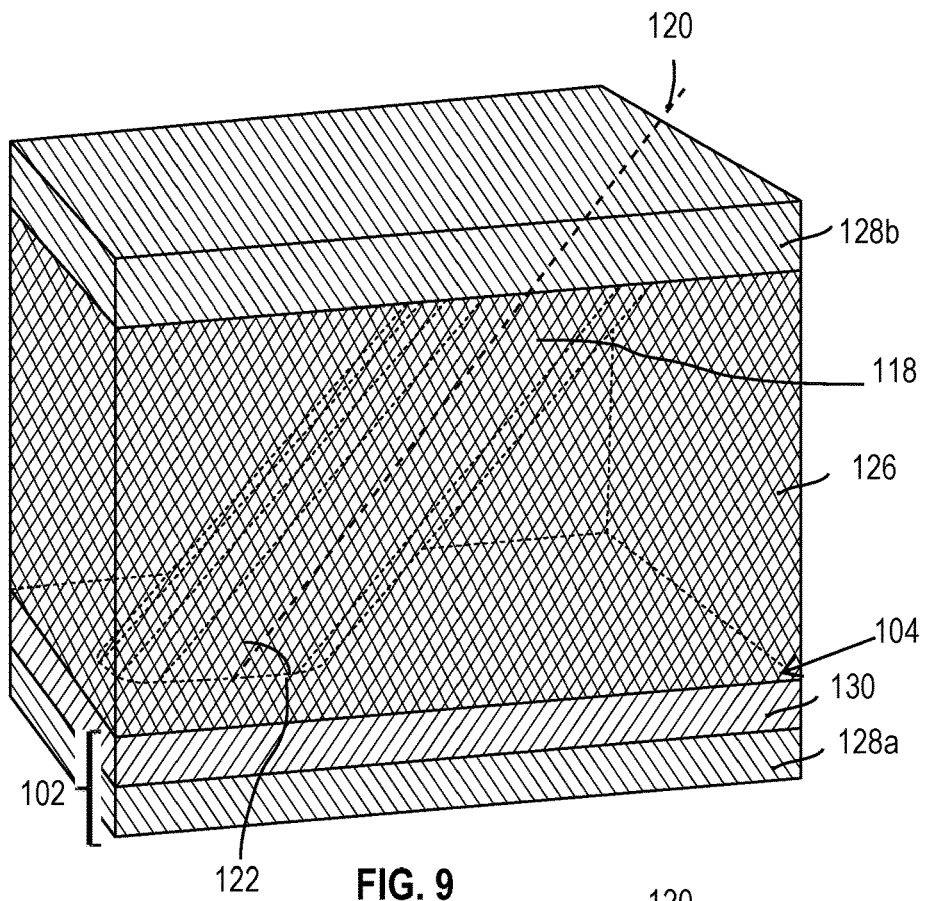
FIG. 9 illustrates a perspective view of a device according to one or more embodiments of the disclosure.

With reference to FIG. 9, in one or more embodiments, dopants are pre-implanted into the angled channel 118 to define a second p-well or n-well epitaxial layer 128*b*. In one or more embodiments, the dopant is selected from one or more of boron (B), arsenic (As), phosphorous (P), antimony (Sb), aluminum (Al), gallium (Ga), selenium (Se), tellurium (Te), magnesium (Mg), zinc (Zn), cadmium (Cd), silicon (Si), germanium (Ge), and the like.

Figure 10:
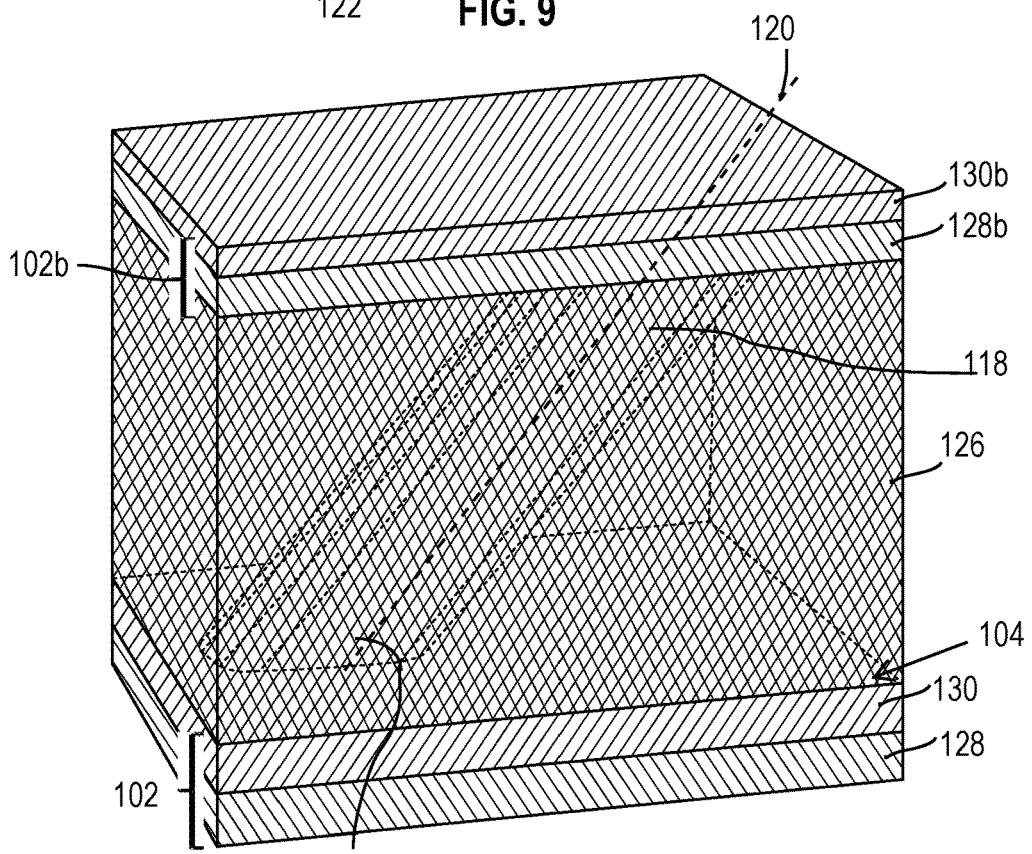
FIG. 10 illustrates a perspective view of a device according to one or more embodiments of the disclosure.

With reference to FIG. 10, in one or more embodiments, the second p-well or n-well epitaxial layer 128*b* is laser repaired and/or treated to improve electron mobility and provide a second laser repaired surface 130*b* on the second p-well or n-well epitaxial layer 128*b*. The second p-well or n-well epitaxial layer 128*b* and the second laser repaired surface 130*b* define the semiconductor substrate 102*b*.

Figures 11A, 11B:
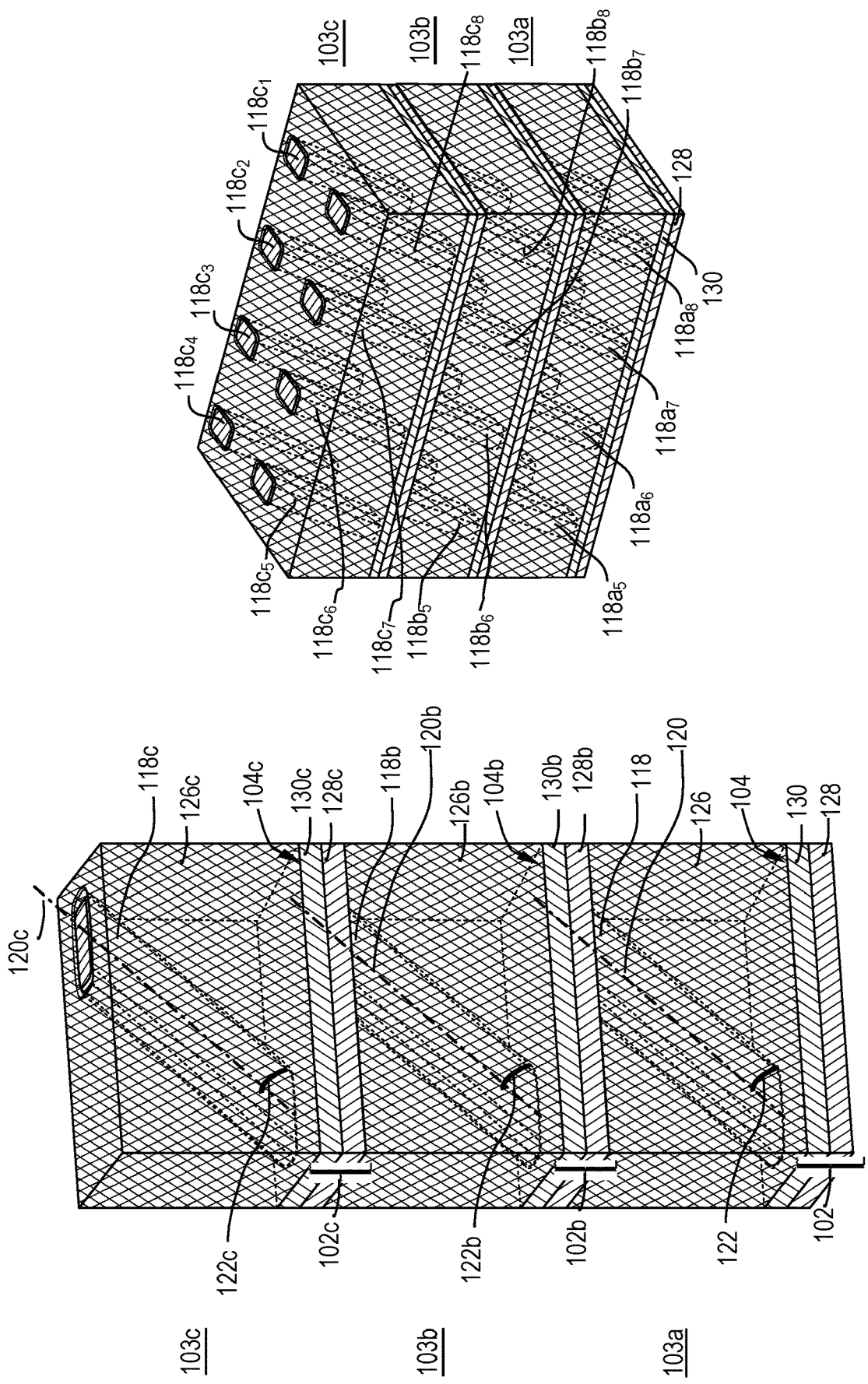
FIG. 11A illustrates a perspective view of a device according to one or more embodiments of the disclosure.
FIG. 11B illustrates a perspective view of a device according to one or more embodiments of the disclosure.

In one or more embodiments, multiple tiers 103 can be stacked on top of one another. With reference to FIG. 11A, three tiers 103*a*, 103*b*, and 103*c* are shown stacked on top of one another. In such embodiments where multiple tiers 103 are stacked on top of one another, each of the angled channels 118 is electrically separated from an adjacent angled channel 118. With reference to FIG. 11B, when three tiers 103*a*, 103*b*, and 103*c* are stacked on top of one another, each tier 103 has multiple angled channels 118 adjacent one another horizontally, which are then electrically separated from angled channels 118 above and/or below in another tier 103. As used herein, the term "electrically separated" means that the flow of electrons through the angled channel(s) does not occur between one angled channel and an angled channel adjacent to it, horizontally adjacent or vertically adjacent.

Figure 12A:
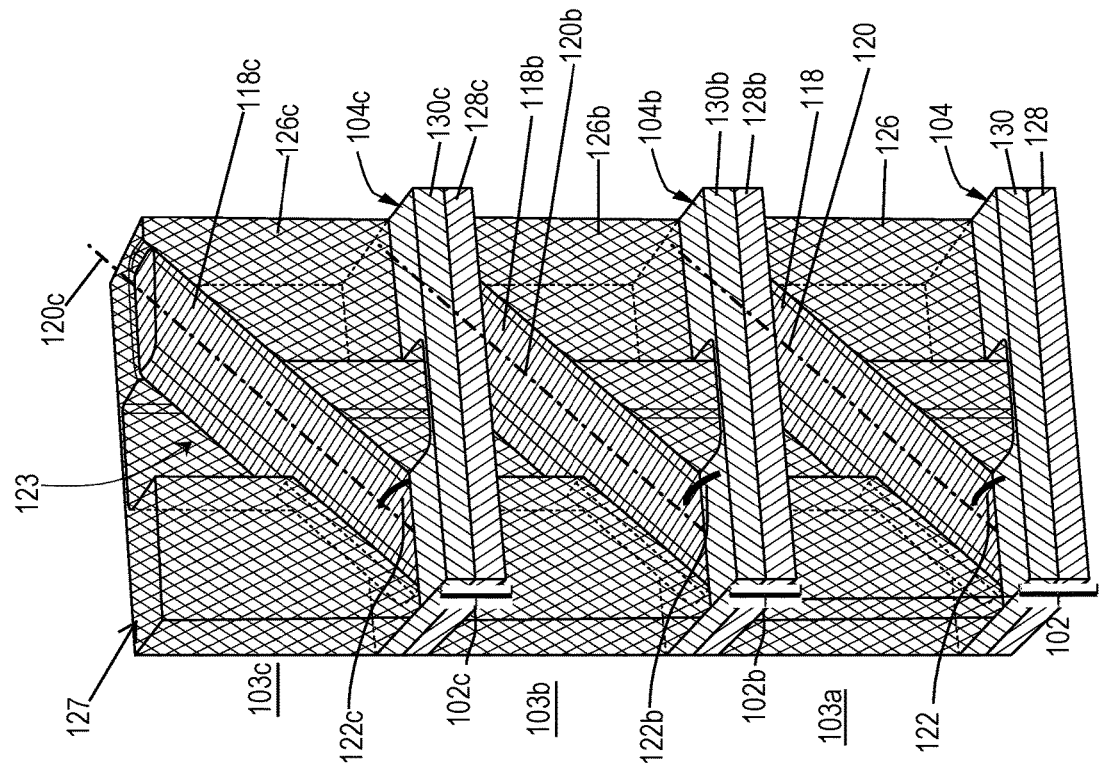
FIG. 12A illustrates a parallel projection view of a device according to one or more embodiments of the disclosure.
Figure 12B:
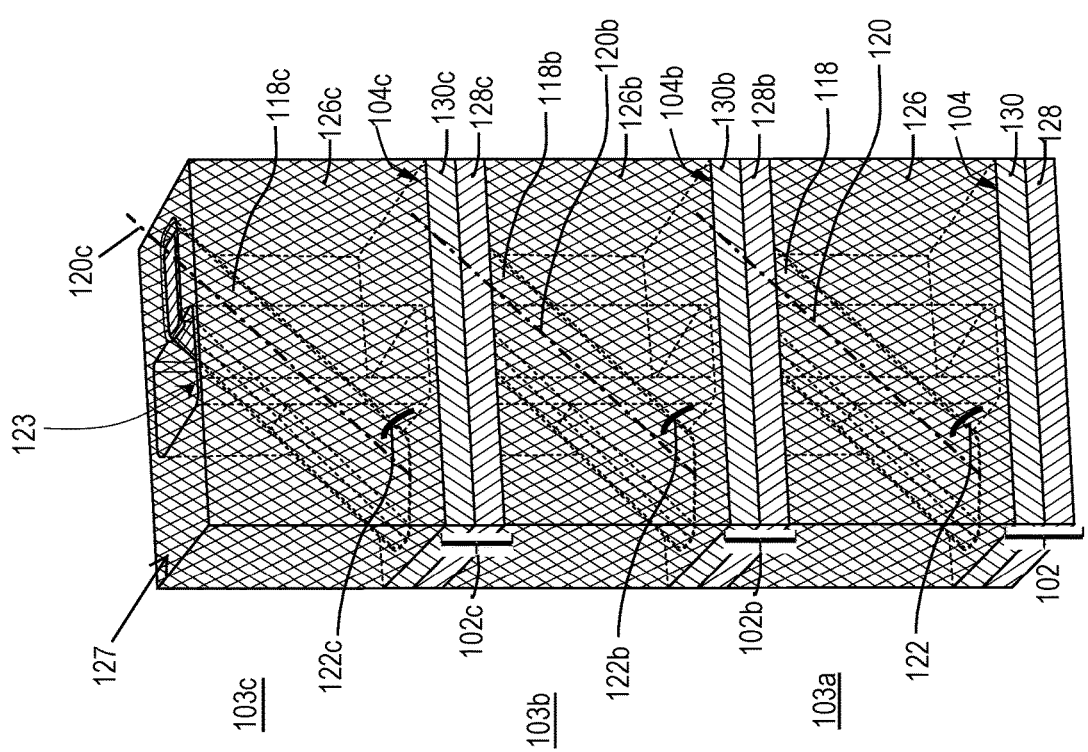
FIG. 12B illustrates a parallel projection view of a device according to one or more embodiments of the disclosure.

FIG. 12A shows a perspective view of an electronic device 100 according to one or more embodiments. FIG. 12B shows a cross-section view of the electronic device 100 illustrated in FIG. 12B. Referring to FIGS. 12A and 12B, an opening 123 is formed from a top surface 127 of the dielectric layer 126 to the top surface 104 of the semiconductor substrate 102. In one or more embodiments, the opening 123 goes through the second p-well or n-well epitaxial layer 128*b*, 128*c*, 128*d*, etc. and the second and subsequent laser repaired surface 130*b*, 130*c*, 130*d*, etc., but the opening 123 does not go through the first p-well or n-well epitaxial layer 128 and the first laser repaired surface 130. In one or more embodiments, the opening 123 is formed by any patterning and/or etching technique known to one of skill of the art. For example, in one or more embodiments, one or more of inductively coupled plasma (ICP) etching, reactive ion etching (RIE), or capacitively coupled plasma (CCP) etching is used to form opening 123. In one or more embodiments, the opening 123 has a high aspect-ratio. For example, in one or more embodiments, the aspect ratio of the opening 123 is greater than about 5:1. As used herein, the term "aspect ratio" refers to the ratio of the depth (or height) of the opening to the width of the opening. In some embodiments, the aspect ratio of the opening 123 is greater than or equal to about 5:1, 10:1, 15:1, 20:1, 25:1, 30:1, 35:1 or 40:1. In one or more embodiments the aspect ratio is greater than 10:1.

In one or more embodiments, the opening 123 is substantially orthogonal to the top surface 104 of the semiconductor substrate 102. As used herein, the term "substantially orthogonal" means that the opening 123 is oriented relative to the top surface 104 of the semiconductor substrate 102 such that the angle where the opening 123 and the semiconductor substrate intersect is about 90°.

Figure 13A:
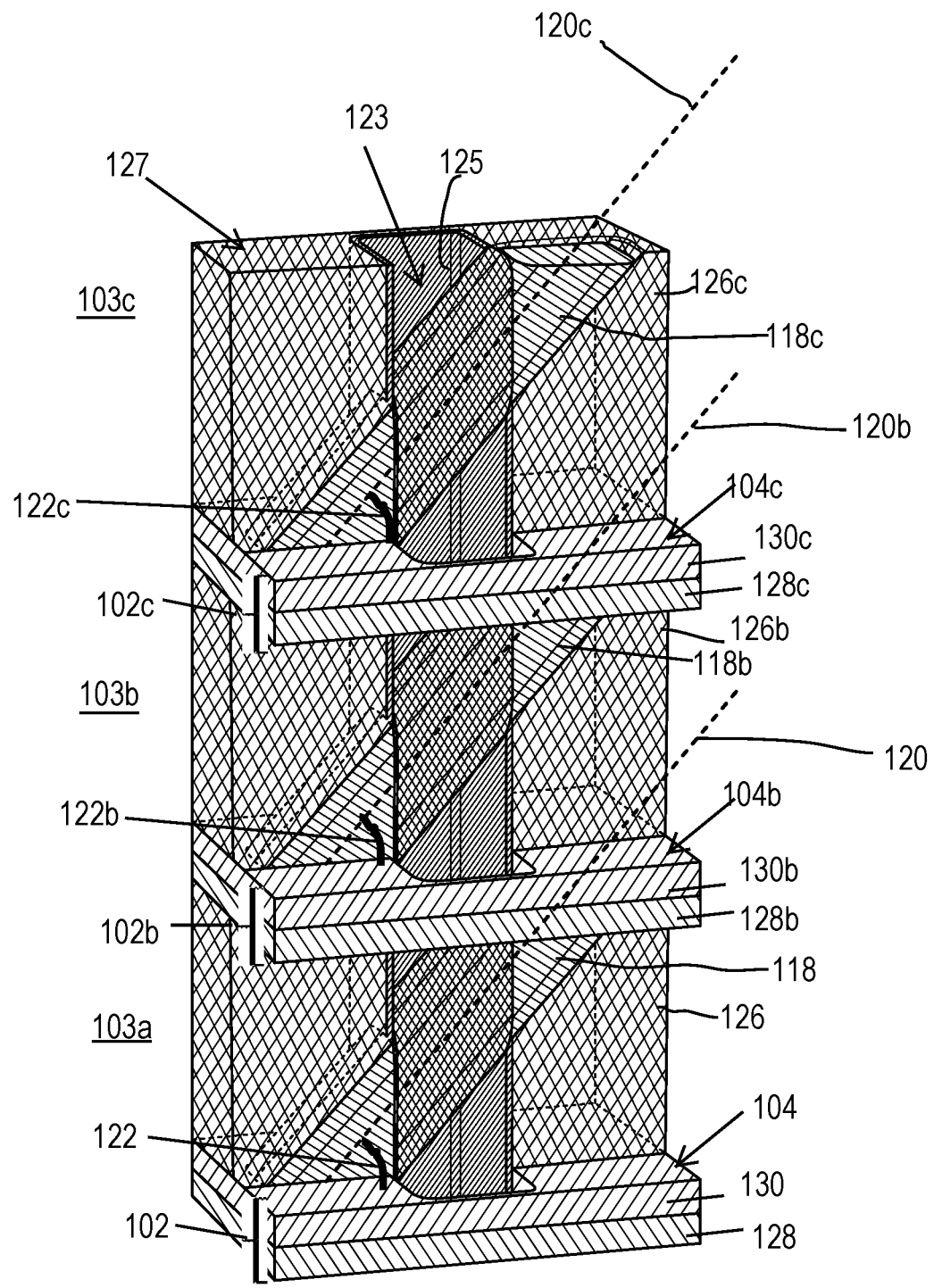
FIG. 13A illustrates a parallel projection view of a device according to one or more embodiments of the disclosure.

Referring to FIG. 13A, after the opening 123 is formed, a etch stop layer 125 is deposited into the opening 123 enclosing the angled channel 118. In one or more embodiments, the etch stop layer 125 acts as an etch stop layer to prevent exposing the angled channel 118. In one or more embodiments, the etch stop layer 125 is any dielectric material known to one of skill in the art. Without intending to be bound by theory, in one or more embodiments, the etch stop layer 125 is a different material than the dielectric layer 126 such that the etch stop layer 125 acts as an etch stop layer for the subsequent source/drain etching and enables isotropic etching in later processing stages. In one or more embodiments, the etch stop layer 125 comprises a dielectric material with atoms of one or more of silicon, aluminum, carbon, oxygen, hydrogen, or nitrogen. For example, the etch stop layer 125 comprises one or more of silicon oxide, titanium oxide, aluminum oxide, or silicon nitride. In one or more embodiments, the etch stop layer 125 is deposited by one or more of ALD or CVD and comprises one or more of aluminum oxide, silicon nitride, or any selective material which has a different etch selectivity than dielectric layer 126. In one or more embodiments, the etch stop layer 125 is planarized, polished, or etched such that the etch stop layer 125 is not on a top surface 127 of the electronic device 100.

In one or more embodiments, the etch stop layer 125 inside the gate opening 123 enables the source/drain contacts to self-align to the gate 124. Without intending to be bound be theory, this self-alignment means that the dielectric layer 126 and the etch stop layer 125 have good etch selectivity contrast, which will lessen overlay requirements.

Figure 13B:
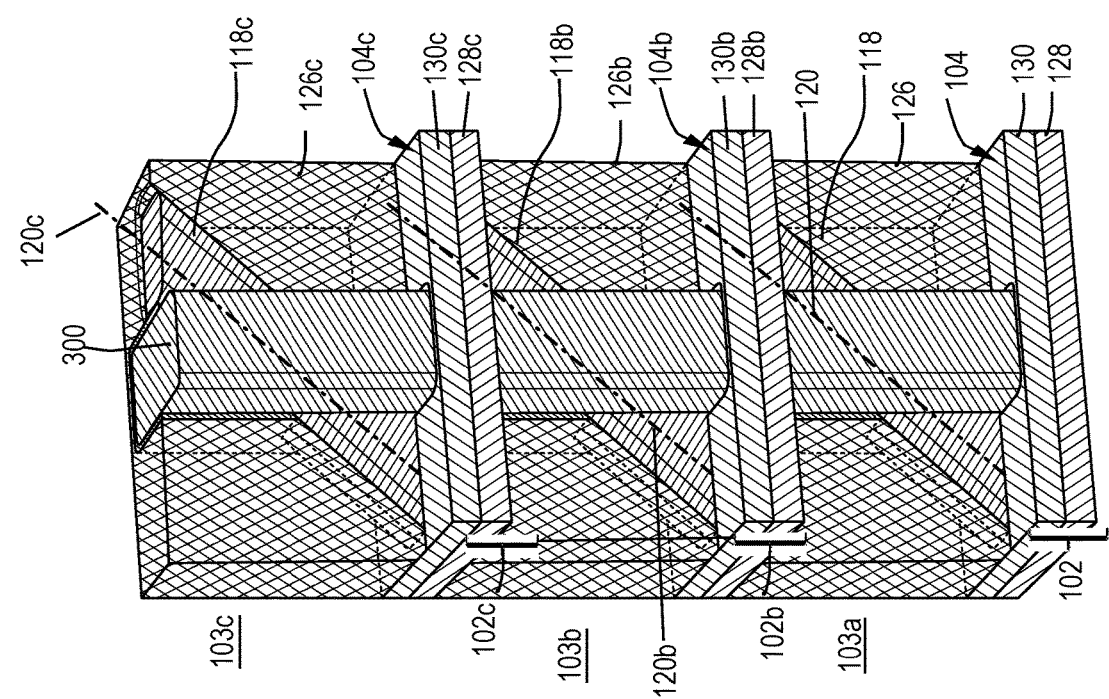
FIG. 13B illustrates a parallel projection view of a device according to one or more embodiments of the disclosure.

Referring to FIG. 13B, a dummy gate 300 is deposited in the opening 123 over the etch stop layer 125. In one or more embodiments, the dummy gate 300 can be made of any suitable material known to the skilled artisan. In one or more embodiments, the dummy gate 300 comprises one or more of polycrystalline silicon, amorphous silicon, microcrystalline silicon, or the like. In one or more embodiments, the deposition of the dummy gate 300 forms an overburden (not illustrated), which can be removed by any planarization technique known to one of skill in the art such that the dummy gate 300 is substantially coplanar with the top surface 127 of the dielectric layer 126. In other embodiments, the overburden (not illustrated) of dummy gate 300 is removed at a later stage in processing to limit time and costs.

Figure 14:
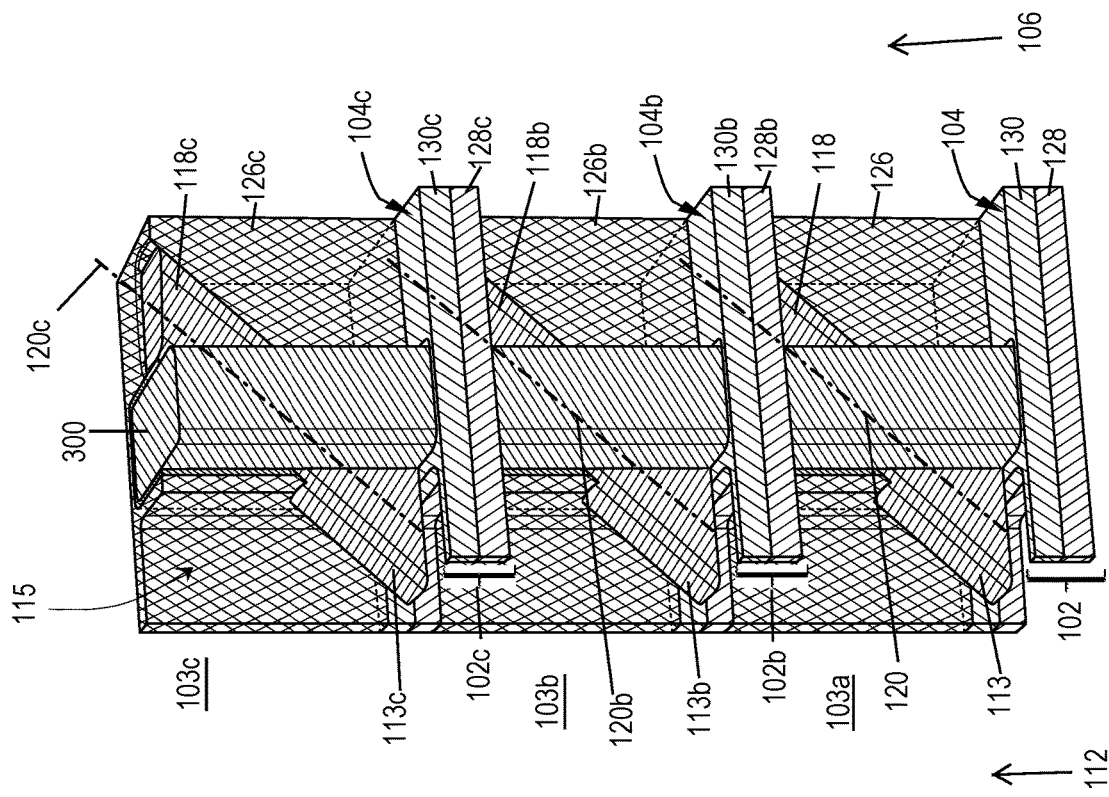
FIG. 14 illustrates a parallel projection view of a device according to one or more embodiments of the disclosure.

Referring to FIG. 14, In one or more embodiments, a self-aligned-contact-hole (SACH) enables source/drain contact and gate patterning self-alignment, using etch selectivity, in case there are overlay (OVL) and/or edge placement errors (EPE) between source/drain contact and gate patterning.

In one or more embodiments, the etch stop layer 125 prevents lateral etch attack of the dummy gate 300. Thus, without intending to be bound by theory, the etch stop layer 125 is critical to ensuring that dielectric scum below the angled channel 118 protrusion is completely removed. Without the etch stop layer 125, isotropic etching cannot be performed and there will be not etch selectivity between the dielectric layer 126 and the etch stop layer 125. Without the isotropic etch, only anisotropic ICP, CCP, or RIE etching can be conducted, which results in scum under the angled channel 118 protrusion. In subsequent processing, anisotropic etch to pattern the source/drain contact openings can't remove the dielectric scum on the lower angled channel 118 protrusion, which are blocked by the top angled channel 118 protrusion. In other words, the etch stop layer 125 and the dielectric layer 126 are of different materials having good etch selectivity. For example, in one or more embodiments, the dielectric layer 126 comprises silicon oxide, and the etch stop layer 125 comprises silicon nitride.

Referring to FIG. 14, a drain region 112 is on the top surface 104 of the semiconductor substrate 102 opposite a source region 106. As recognized by one of skill in the art, while drain region 112 is being referred to herein as the drain region, depending upon the preference of the skilled artisan, this may be the source region having a source portion and a source contact. After deposition of the dummy gate 300, a drain portion 113 of the angle channel 118 is exposed. In one or more embodiments, the exposing of the drain portion 113 can be referred to as "source-drain patterning". During the "source-drain patterning," a hole for the drain contact is formed. The exposing of the drain portion 113 can be accomplished any suitable process known to the skilled artisan. For example, in one or more embodiments, inductively coupled plasma (ICP) etching, reactive ion etching (RIE), or capacitively coupled plasma (CCP) etching is used to expose the drain portion 113. In one or more embodiments, the drain contact hole 115 has a high aspect-ratio. For example, in one or more embodiments, the aspect ratio of the drain contact hole 115 is greater than about 5:1. As used herein, the term "aspect ratio" refers to the ratio of the depth (or height) of the hole to the width of the hole. In some embodiments, the aspect ratio of the drain contact hole 115 is greater than or equal to about 5:1, 10:1, 15:1, 20:1, 25:1, 30:1, 35:1 or 40:1. In one or more embodiments the aspect ratio is greater than 10:1.

In one or more embodiments, the etch stop layer 125 (not visible in FIG. 14) is under/around the wall of the dummy gate 300. The etch stop layer 125 acts an etch stop layer to enable isotropic etching during "source-drain patterning," ensuring that any dielectric scum is removed. Without intending to be bound by the theory, it is thought that anisotropic etch will be blocked by the top of angled channel 118 protrusion. The bottom of the angled channel 118 protrusion will have dielectric scum as a result. Isotropic wet/vapor etch will selectively remove the dielectric scum after anisotropic etch, while the etch stop layer 125 provides selectivity against lateral attack into the dummy gate 300.

Figure 15:
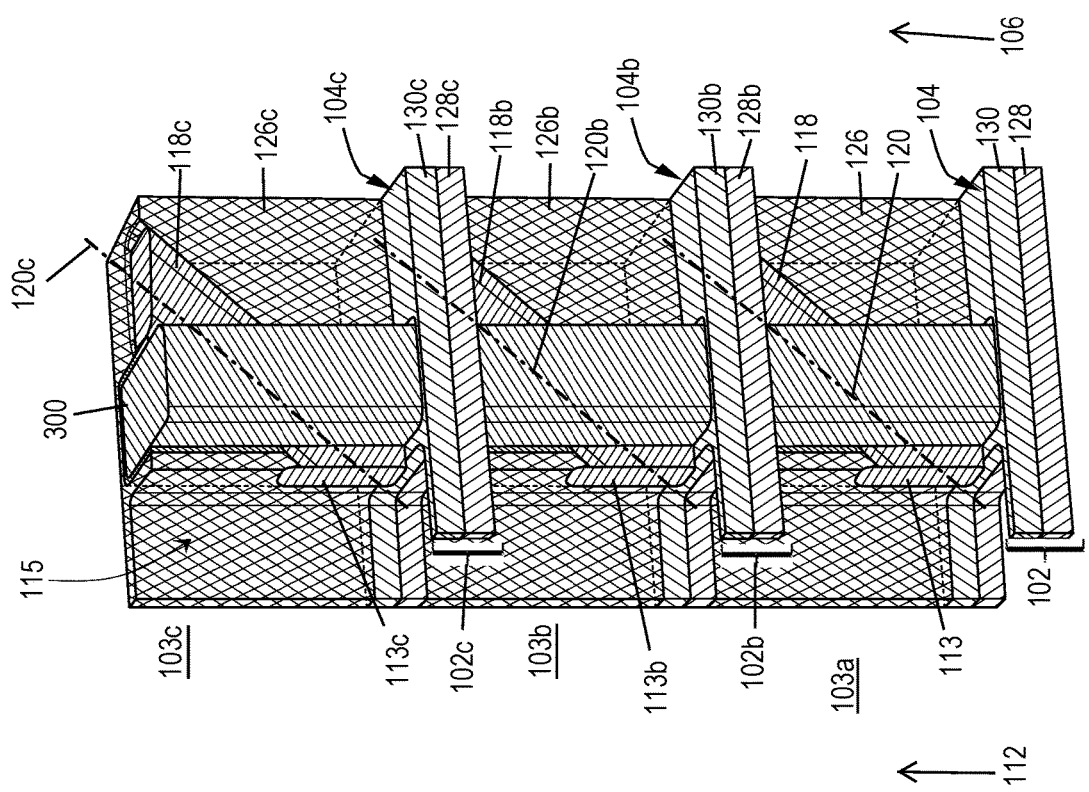
FIG. 15 illustrates a parallel projection view of a device according to one or more embodiments of the disclosure.

With reference to FIG. 15, in one or more embodiments, when the drain contact hole 115 is formed by etching, the exposed drain portion 113 is optionally removed such that the exposed drain portion 113 of the angle channel 118 is substantially coplanar with the dielectric layer 126.

Figure 16:
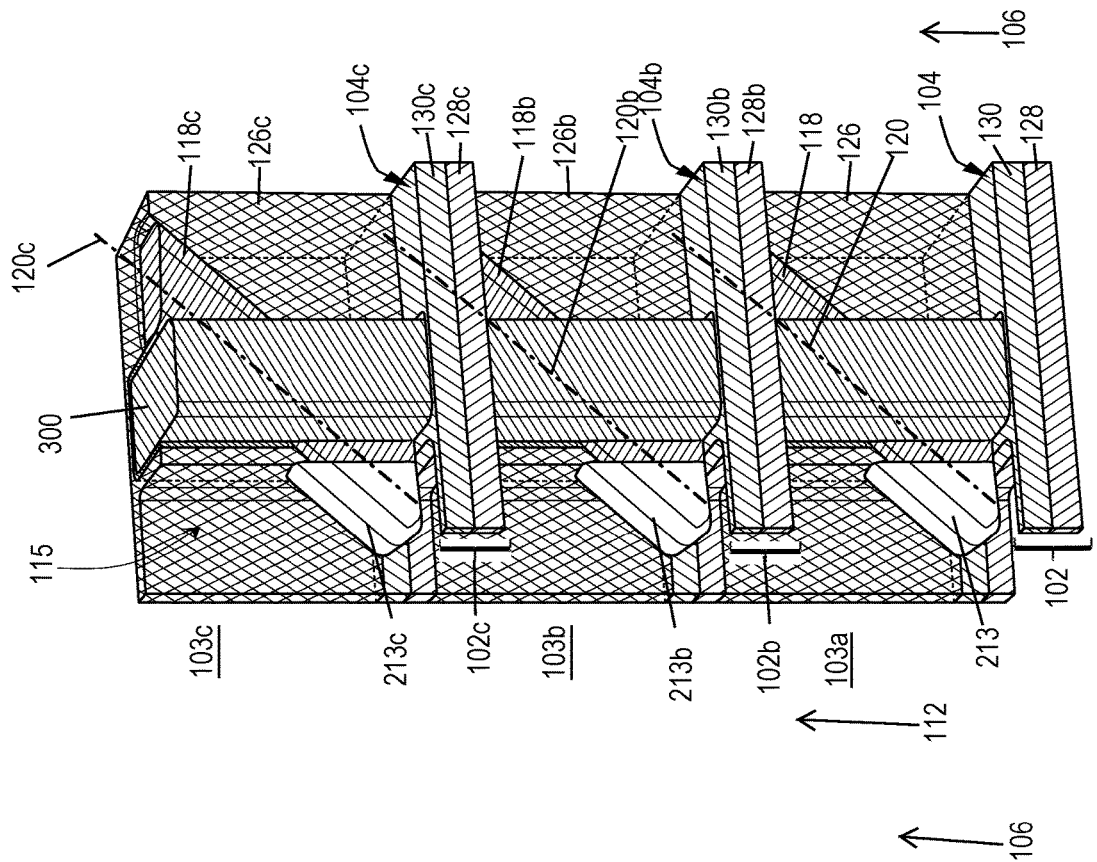
FIG. 16 illustrates a parallel projection view of a device according to one or more embodiments of the disclosure.

Referring to FIG. 16, in one or more embodiments, the exposed drain portion 113 that has been removed (e.g. by etching) is optionally replaced with an epitaxially grown drain portion 213. Without intending to be bound by theory, it is thought that this step may not be necessary because usage of the angled channel 118 already has corrected stress and strain and has sufficient electron mobility.

Figure 17:
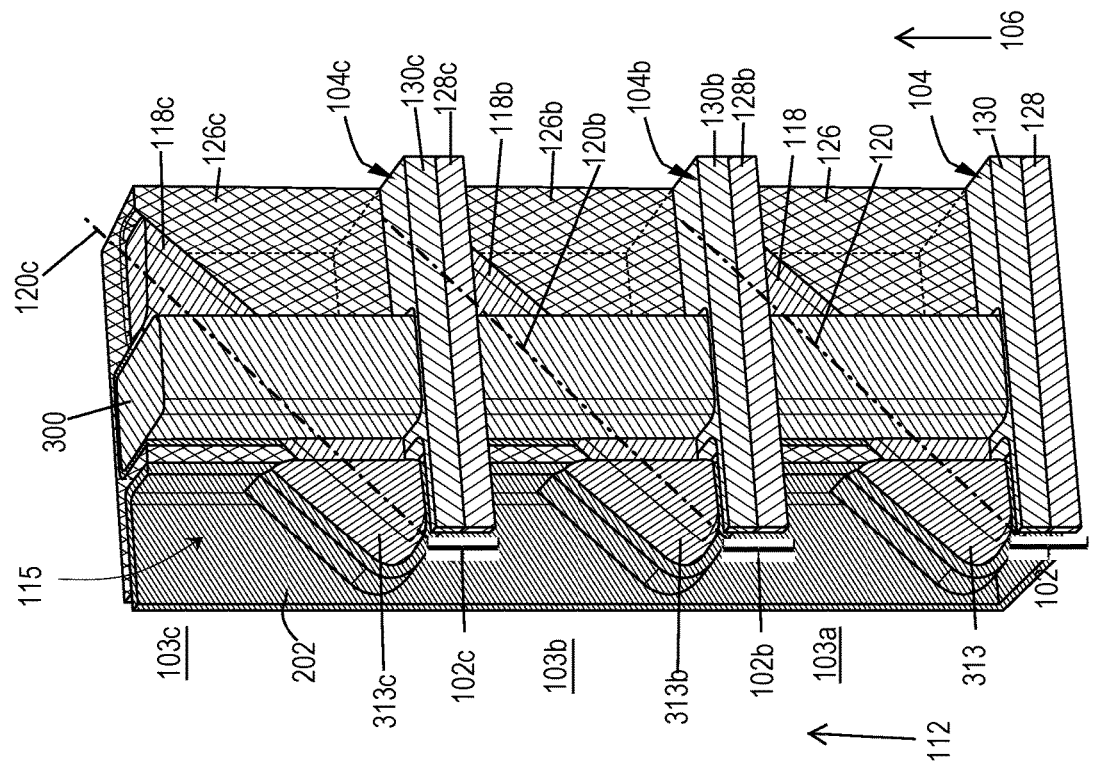
FIG. 17 illustrates a parallel projection view of a device according to one or more embodiments of the disclosure.

With reference to FIG. 17, in the embodiments where the exposed drain portion 113 is removed (e.g. etching) to form the drain contact hole 115 and is replaced with an epitaxially grown drain portion 213, it may be necessary to grow epitaxial crystals with a different crystal lattice and form a stressed or strained epitaxially grown drain portion 313 to firstly replace the angled channel 118, which was earlier damaged by drain etching, and, secondly, to help enhance electron mobility in the angled channel 118.

Figure 18:
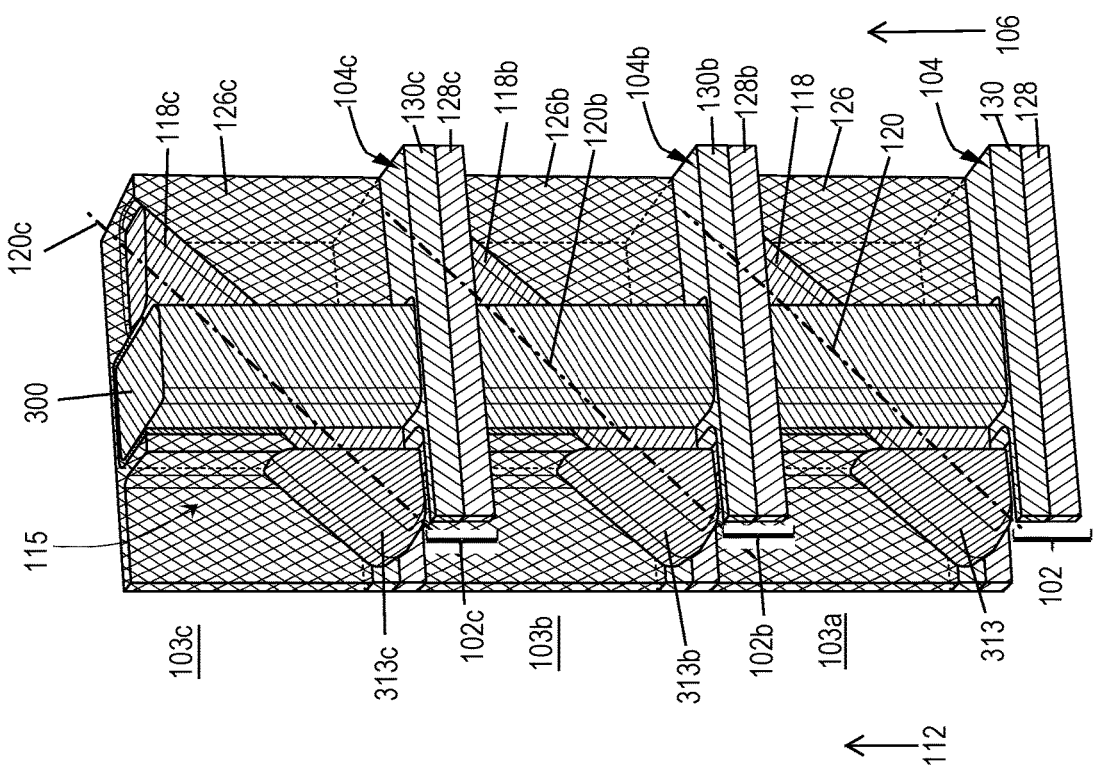
FIG. 18 illustrates a parallel projection view of a device according to one or more embodiments of the disclosure.

With reference to FIG. 18, in one or more embodiments, a barrier layer 202 is deposited in the drain contact hole 115 adjacent to the dummy gate 300. In one or more embodiments, the barrier layer 202 is any barrier layer material known to one of skill in the art. In one or more embodiments, the barrier layer 202 includes one or more of aluminum (Al), titanium (Ti), tantalum (Ta), tungsten (W), tantalum nitride (TaN), titanium nitride (TiN), tungsten carbide (WC), molybdenum, (Mo), manganese (Mn), and the like.

Figure 19:
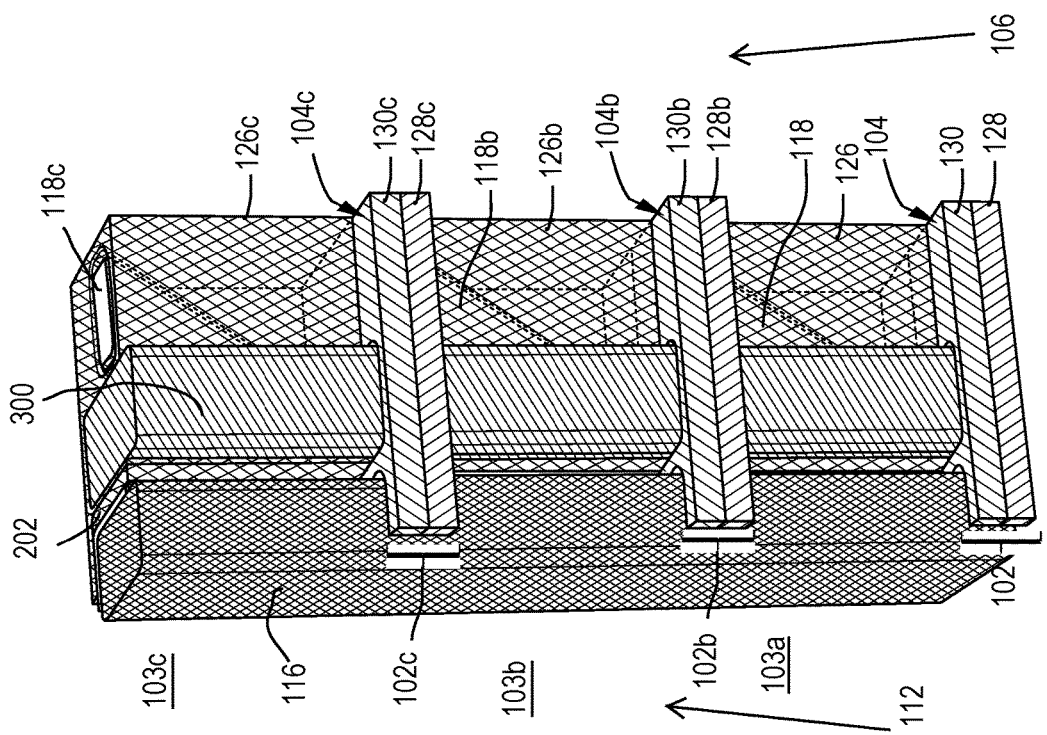
FIG. 19 illustrates a parallel projection view of a device according to one or more embodiments of the disclosure.

Referring to FIG. 19, a drain contact 116 is deposited in the drain contact hole 115. The drain contact 116 is disposed over the drain 114 (not visible in illustration). The drain contact 116 can be any suitable material known to the skilled artisan. In one or more embodiments, the drain contact 116 is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In other embodiments, the drain contact 116 is selected from one or more of tungsten (W) or cobalt (Co). In one or more embodiments, formation of the drain contact 116 is conducted by any suitable process known to the skilled artisan, including, but not limited to ALD, CVD, PVD, MBE, MOCVD, spin-on, or other insulating layer deposition techniques known to the skilled artisan.

Figure 20:
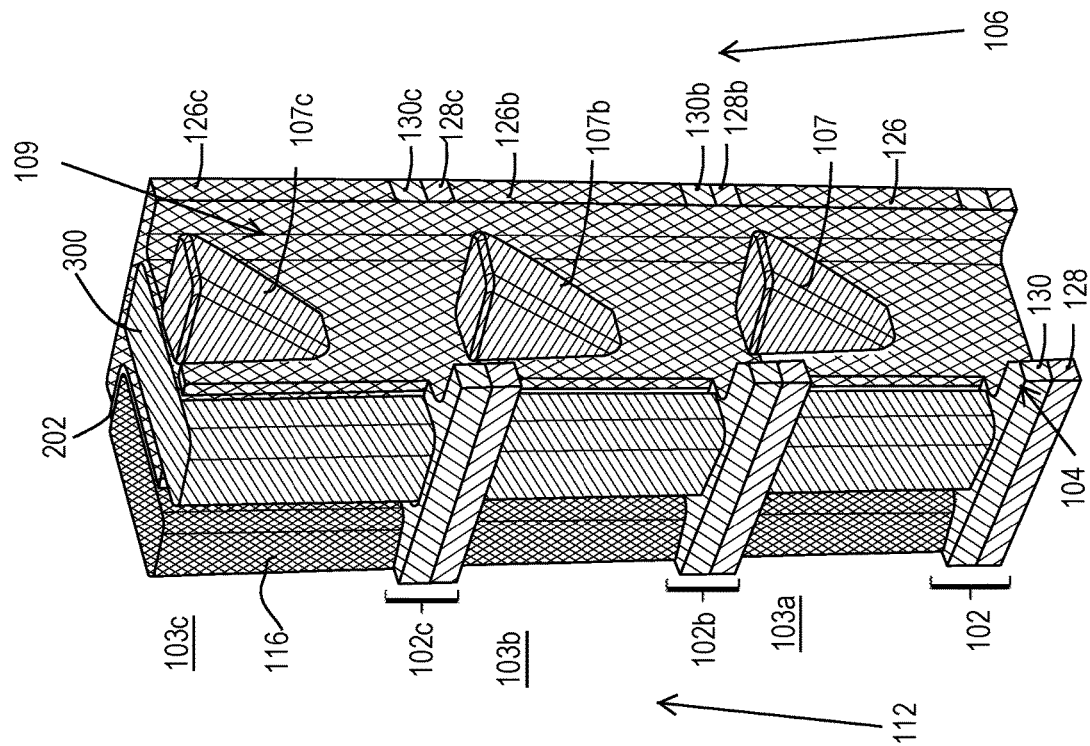
FIG. 20 illustrates a parallel projection view of a device according to one or more embodiments of the disclosure.

FIGS. 20-25 depict the patterning of the source region 106 and the formation of the source contact 110. Referring to FIG. 20, a source region 106 is on the top surface 104 of the semiconductor substrate 102 opposite the drain region 112. After deposition of the drain contact 116, a source portion 107 of the angled channel 118 is exposed. In one or more embodiments, the exposing of the source portion 107 can be referred to as "source-drain patterning". During the "source-drain patterning," a hole for the source contact is formed. The exposing of the source portion 107 can be accomplished any suitable process known to the skilled artisan. For example, in one or more embodiments, inductively coupled plasma (ICP) etching is used to expose the source portion 107. In one or more embodiments, the source contact hole 115 has a high aspect-ratio. For example, in one or more embodiments, the aspect ratio of the source contact hole 109 is greater than about 5:1. As used herein, the term "aspect ratio" refers to the ratio of the depth (or height) of the hole to the width of the hole. In some embodiments, the aspect ratio of the source contact hole 109 is greater than or equal to about 5:1, 10:1, 15:1, 20:1, 25:1, 30:1, 35:1 or 40:1. In one or more embodiments the aspect ratio is greater than 10:1.

Figure 21:
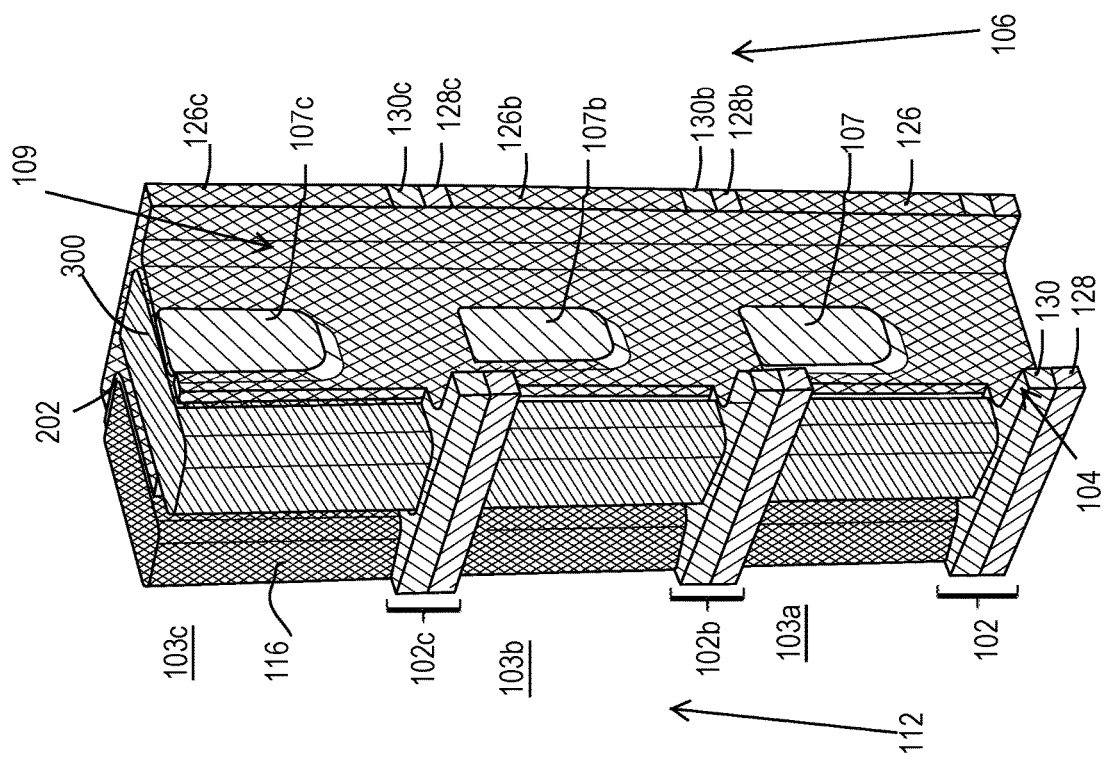
FIG. 21 illustrates a parallel projection view of a device according to one or more embodiments of the disclosure.

With reference to FIG. 21, in one or more embodiments, when the source contact hole 109 is formed by etching, the exposed source portion 107 is optionally removed such that the exposed source contact hole 109 of the angled channel 118 is substantially coplanar with the dielectric layer 126.

Figure 22:
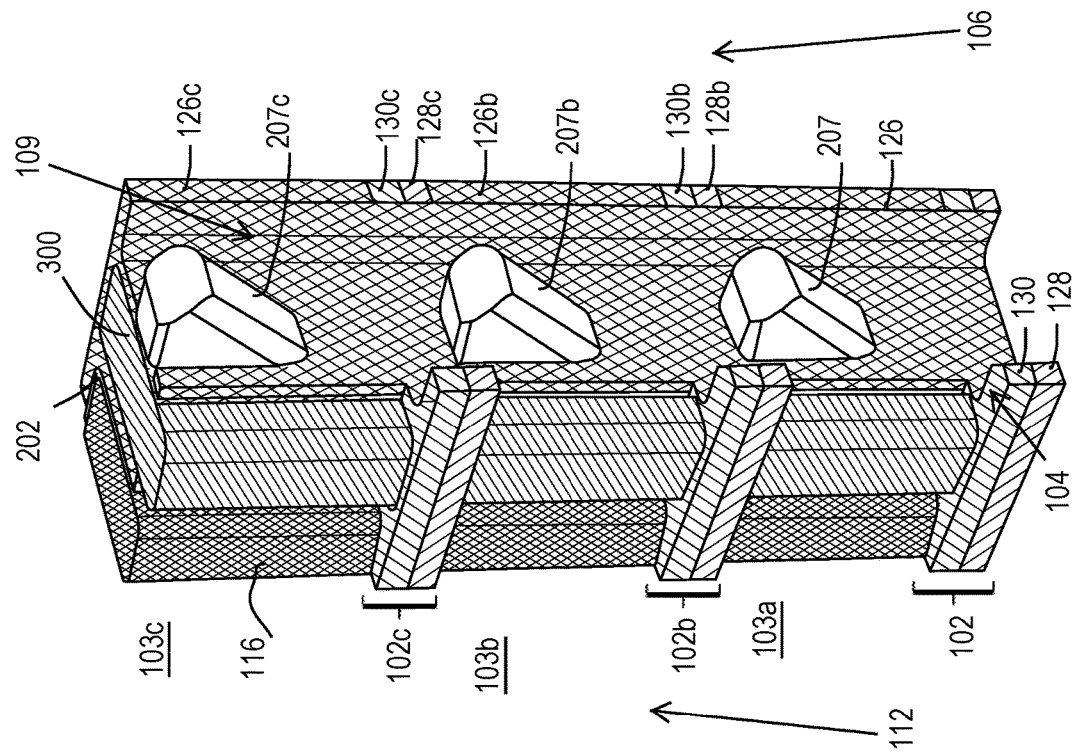
FIG. 22 illustrates a parallel projection view of a device according to one or more embodiments of the disclosure.

Referring to FIG. 22, in one or more embodiments, the exposed source contact hole 109 that has been removed (e.g. by etching) is optionally replaced with an epitaxially grown source portion 207. Without intending to be bound by theory, it is thought that this step may not be necessary because usage of the angled channel 118 already has corrected stress and strain and has sufficient electron mobility.

Figure 23:
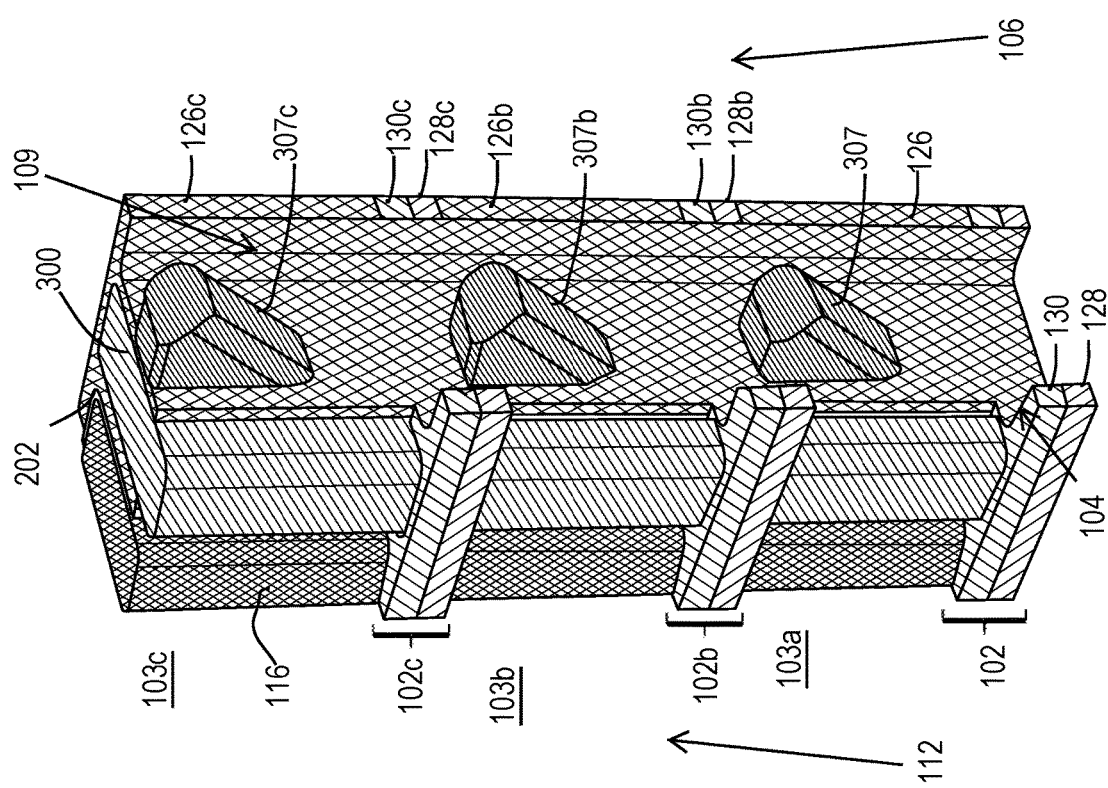
FIG. 23 illustrates a parallel projection view of a device according to one or more embodiments of the disclosure.

With reference to FIG. 23, in the embodiments where the exposed source portion 107 is removed (e.g. etching) during the formation of the source contact hole 109 and is then replaced with an epitaxially grown source portion 207, it may be necessary to grow epitaxial crystals with a different crystal lattice and form a stressed or strained epitaxially grown source portion 307 to firstly replace the angled channel 118, which was earlier damaged by source etching, and, secondly, to help enhance electronic mobility in the angled channel 118.

Figure 24:
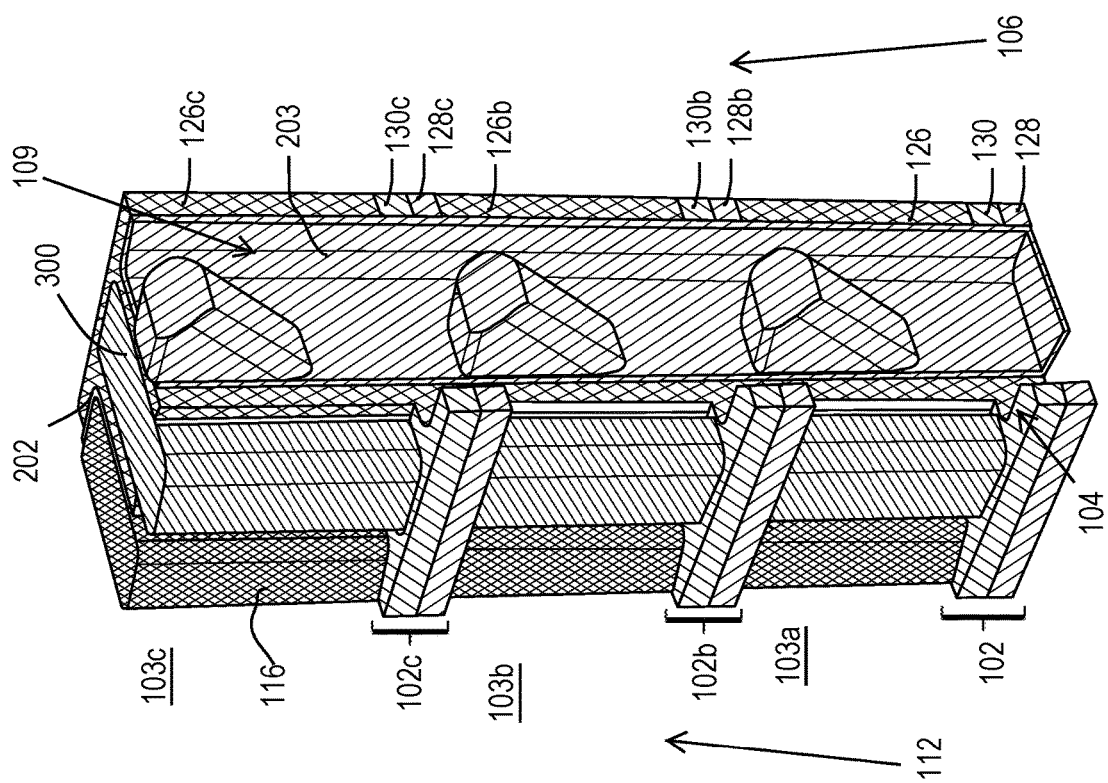
FIG. 24 illustrates a parallel projection view of a device according to one or more embodiments of the disclosure.

With reference to FIG. 24, in one or more embodiments, a barrier layer 203 is deposited in the source contact hole 109 adjacent to the dummy gate 300. In one or more embodiments, the barrier layer 203 is any barrier layer material known to one of skill in the art. In one or more embodiments, the barrier layer 203 includes one or more of aluminum (Al), titanium (Ti), tantalum (Ta), tungsten (W), tantalum nitride (TaN), titanium nitride (TiN), tungsten carbide (WC), molybdenum (Mo), manganese (Mn), and the like.

Figures 25, 26A:
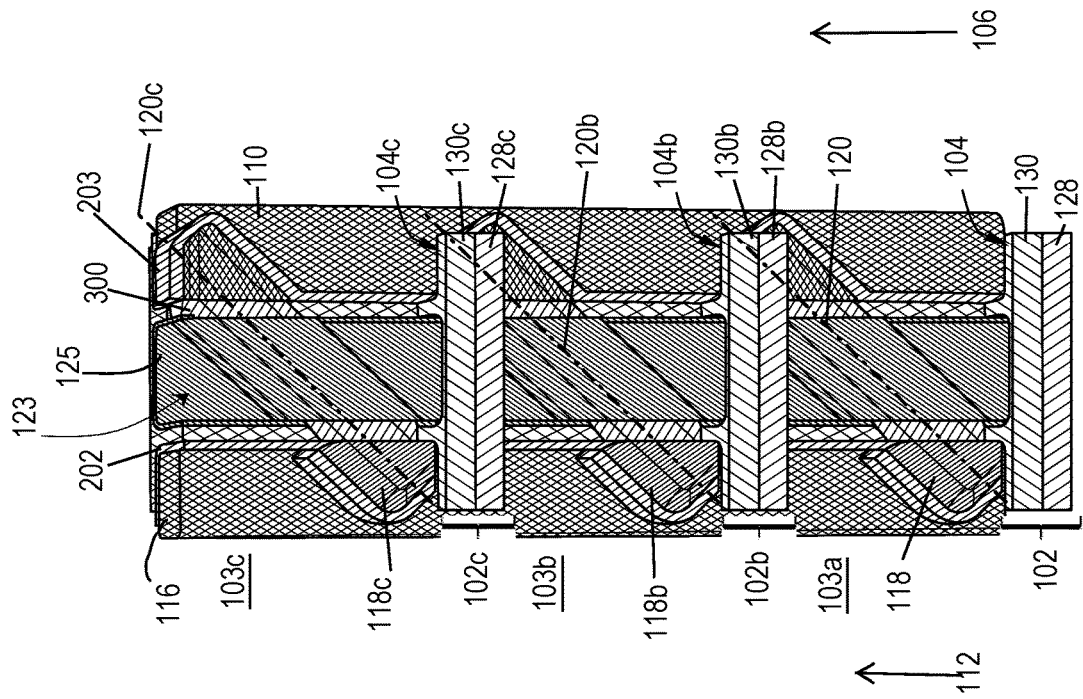
FIG. 25 illustrates a parallel projection view of a device according to one or more embodiments of the disclosure.
FIG. 26A illustrates a front view of a device according to one or more embodiments of the disclosure.

Referring to FIG. 25, a source contact 110 is deposited in the source contact hole 109. The source contact 110 is disposed over the source 108 (not visible in illustration). The source contact 110 can be any suitable material known to the skilled artisan. In one or more embodiments, the source contact 110 is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In other embodiments, the source contact 110 is selected from one or more of tungsten (W) or cobalt (Co). In one or more embodiments, formation of the source contact 110 is conducted by any suitable process known to the skilled artisan, including, but not limited to ALD, CVD, PVD, MBE, MOCVD, spin-on, or other insulating layer deposition techniques known to the skilled artisan.

With reference to FIG. 26A, after both the source and drain contacts 110, 116 are deposited, the dummy gate 300 is removed and the opening 123 is reformed. In one or more embodiments, the dummy gate 300 is removed by any suitable process known to the skilled artisan. Without intending to be bound by theory, it is thought that the etch stop layer 125 that is coating the opening 123 and the angled channel 118 will act as an etch stop layer to prevent erosion of the opening 123 and the angled channel 118. In one or more embodiments, the damaged etch stop layer 125 is removed after the dummy gate 300 is removed.

Figure 26B:
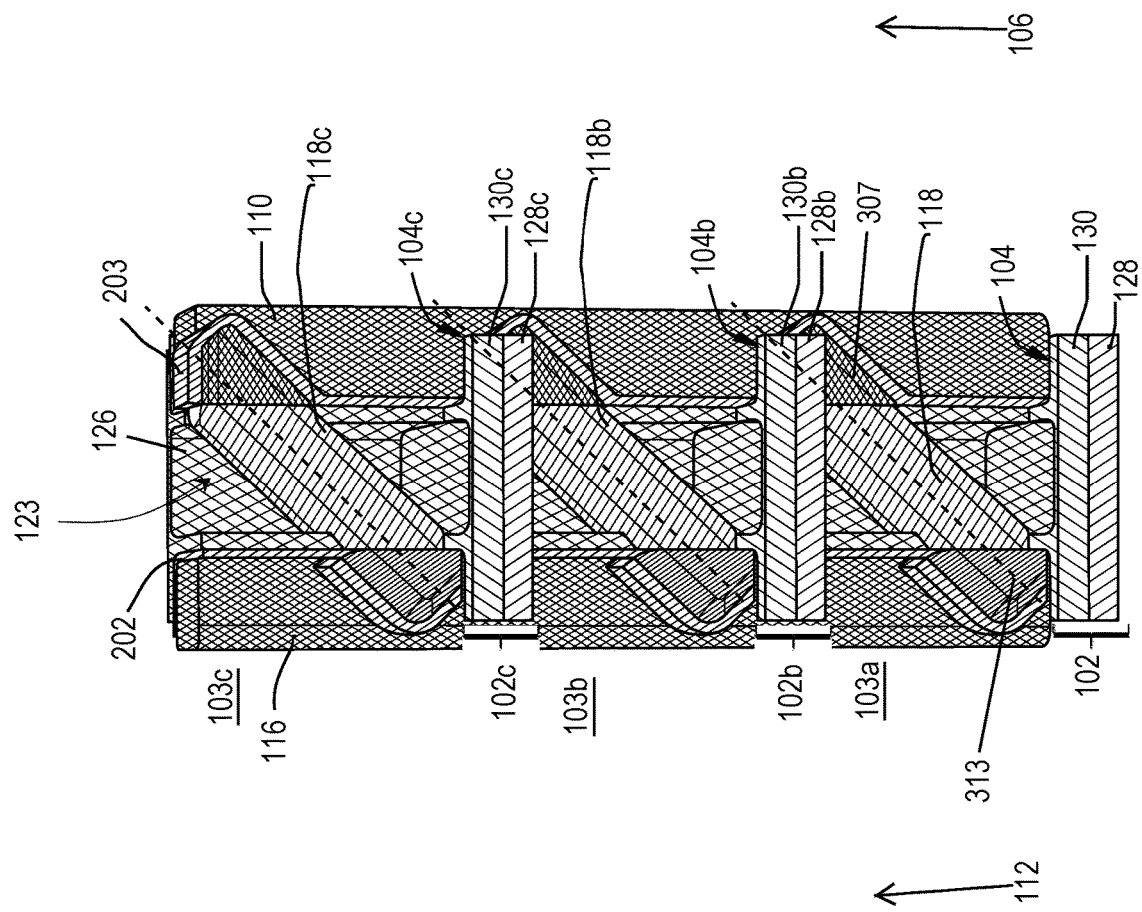
FIG. 26B illustrates a front view of a device according to one or more embodiments of the disclosure.

With reference to FIG. 26B, after the dummy gate 300 is removed, the etch stop layer 125 is removed, exposing the angled channel 118.

Figure 27:
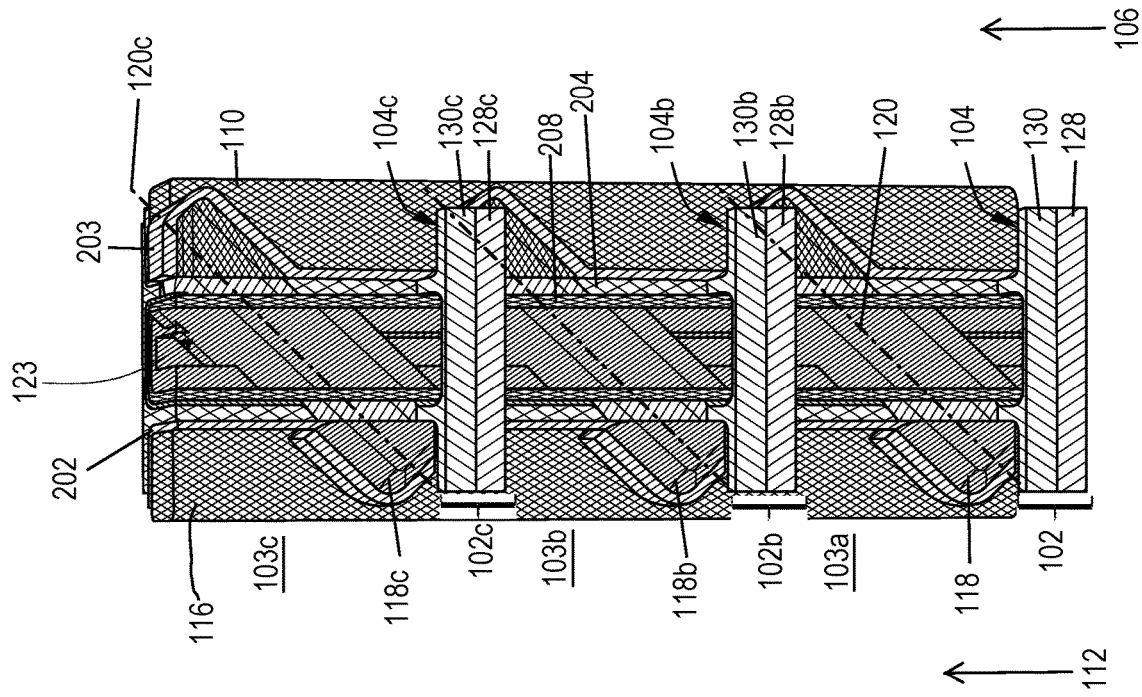
FIG. 27 illustrates a front view of a device according to one or more embodiments of the disclosure.

Referring to FIG. 27, in one or more embodiments, a gate oxide 204 is optionally deposited in the opening 123 enclosing the angled channel 118. The gate oxide 204 can be any suitable material known to the skilled artisan. The gate oxide 204 can be deposited using one or more deposition techniques known to one of ordinary skill in the art of microelectronic device manufacturing. In one or more embodiments, gate oxide 204 is deposited using one of deposition techniques, such as, but not limited to, ALD, CVD, PVD, MBE, MOCVD, spin-on, or other insulating layer deposition techniques known to the skilled artisan. In one or more embodiments, gate oxide 204 comprises a low-K dielectric. In some embodiments, the low-K dielectric is selected from one or more of silicon, silicon oxide, silicon nitride, silicon oxynitride, silicon oxycarbide, silicon carbooxynitride, SiCONH, doped silicon, doped silicon oxide, doped silicon nitride, doped silicon oxynitride, spin-on dielectrics, or diffusion species growths. In one or more embodiments, gate oxide 204 comprises a silicon oxide. In one or more embodiments, the gate oxide 204 can be combined with a high-K dielectric layer 206 (not illustrated) deposited on the gate oxide 204 between the angled channel 118 and the gate 124. The high-K dielectric layer 206 can be any suitable high-K dielectric material known to the skilled artisan. In one or more embodiments, the high-K dielectric layer 206 comprises hafnium oxide or lanthanum (La) doped high-K dielectrics. In one or more embodiments, the high-K dielectric layer 206 is deposited using one of deposition techniques, such as, but not limited to, ALD, CVD, PVD, MBE, MOCVD, spin-on, or other insulating layer deposition techniques known to the skilled artisan.

Figure 28:
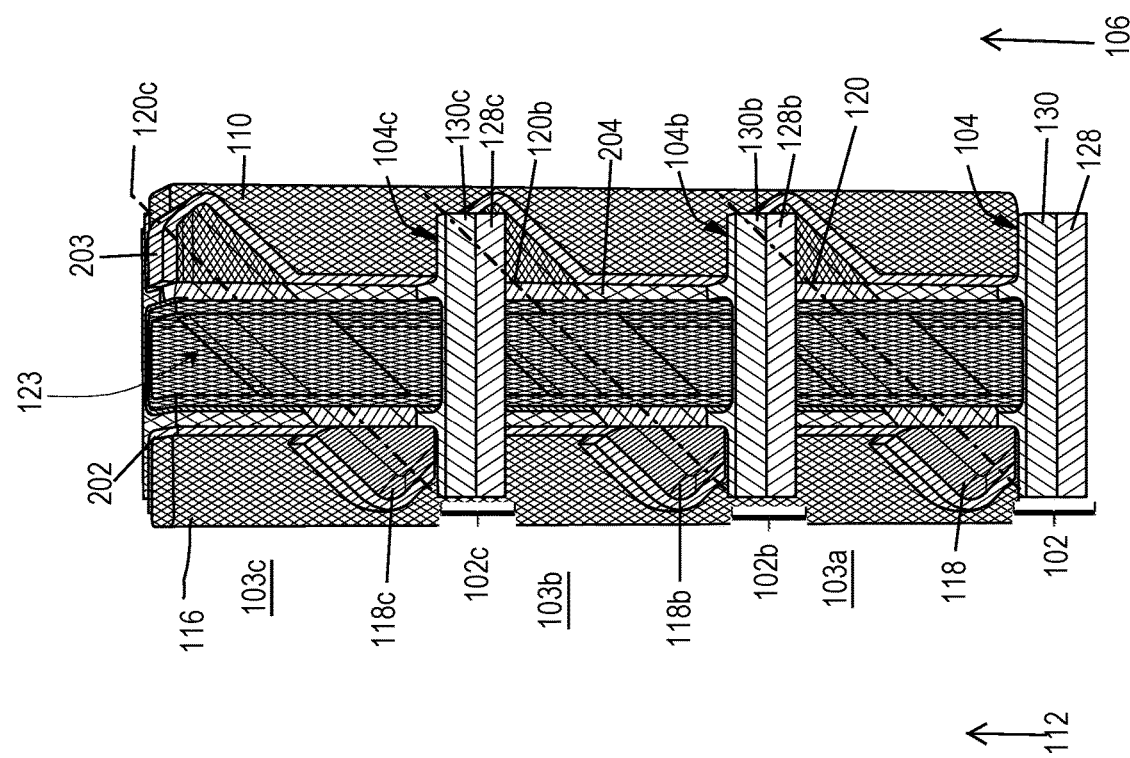
FIG. 28 illustrates a front view of a device according to one or more embodiments of the disclosure.

Referring to FIG. 28, at least one work-function metal 208 (or work-function metal layers) can be deposited on one or more of the high-K dielectric layer 206 or the gate oxide 204 between the angled channel 118 and the gate 124. The at least one work-function metal 208 (or work-function metal layers) can be any suitable work-function metal known to the skilled artisan. In one or more embodiments, the at least one work-function metal 208 comprises one or more of aluminum (Al), aluminum carbide (AlC), aluminum titanium carbide (AlTiC), titanium oxynitride (TiON), titanium aluminum carbochloride (TiAlCCl), titanium aluminum carbofluoride (TiAlCF), titanium aluminum carbooxychlorofluoride (TiAlCOClF), titanium aluminum carbooxyfluorchloride (TiAlCOFCl), titanium aluminum carbide (TiAlC), tantalum (Ta), tungsten (W), titanium carbide (TiC), titanium nitride (TiN), tantalum nitride (TaN), or titanium aluminum nitride (TiAlN).

Figure 29:
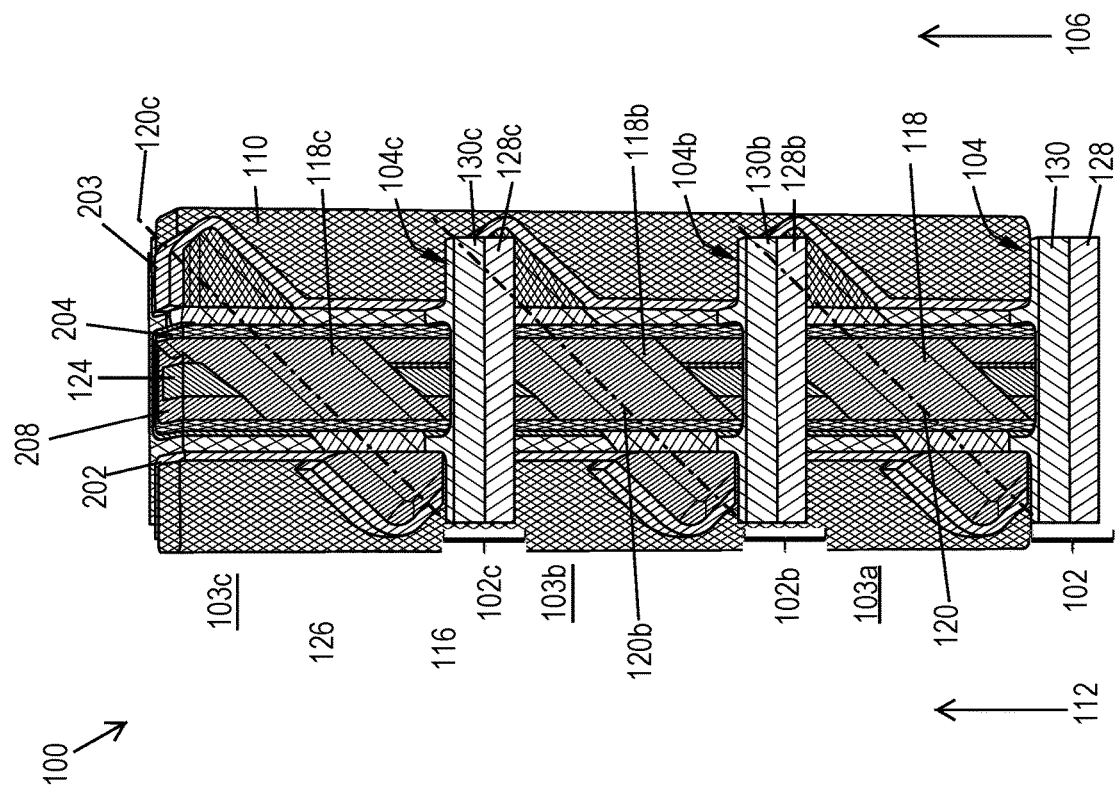
FIG. 29 illustrates a front view of a device according to one or more embodiments of the disclosure.
Figure 30:
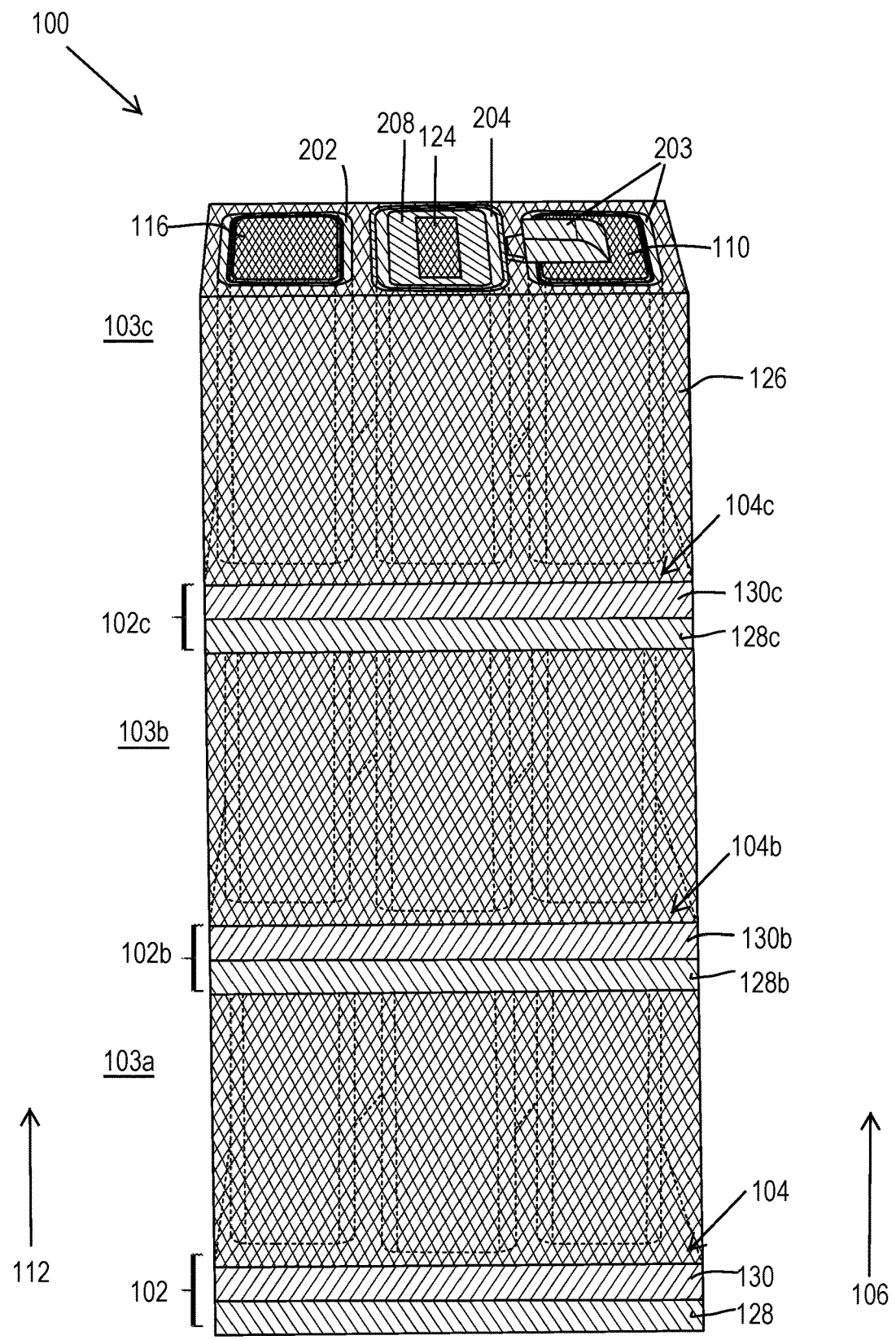
FIG. 30 illustrates a front view of a device according to one or more embodiments of the disclosure.
Figure 31:
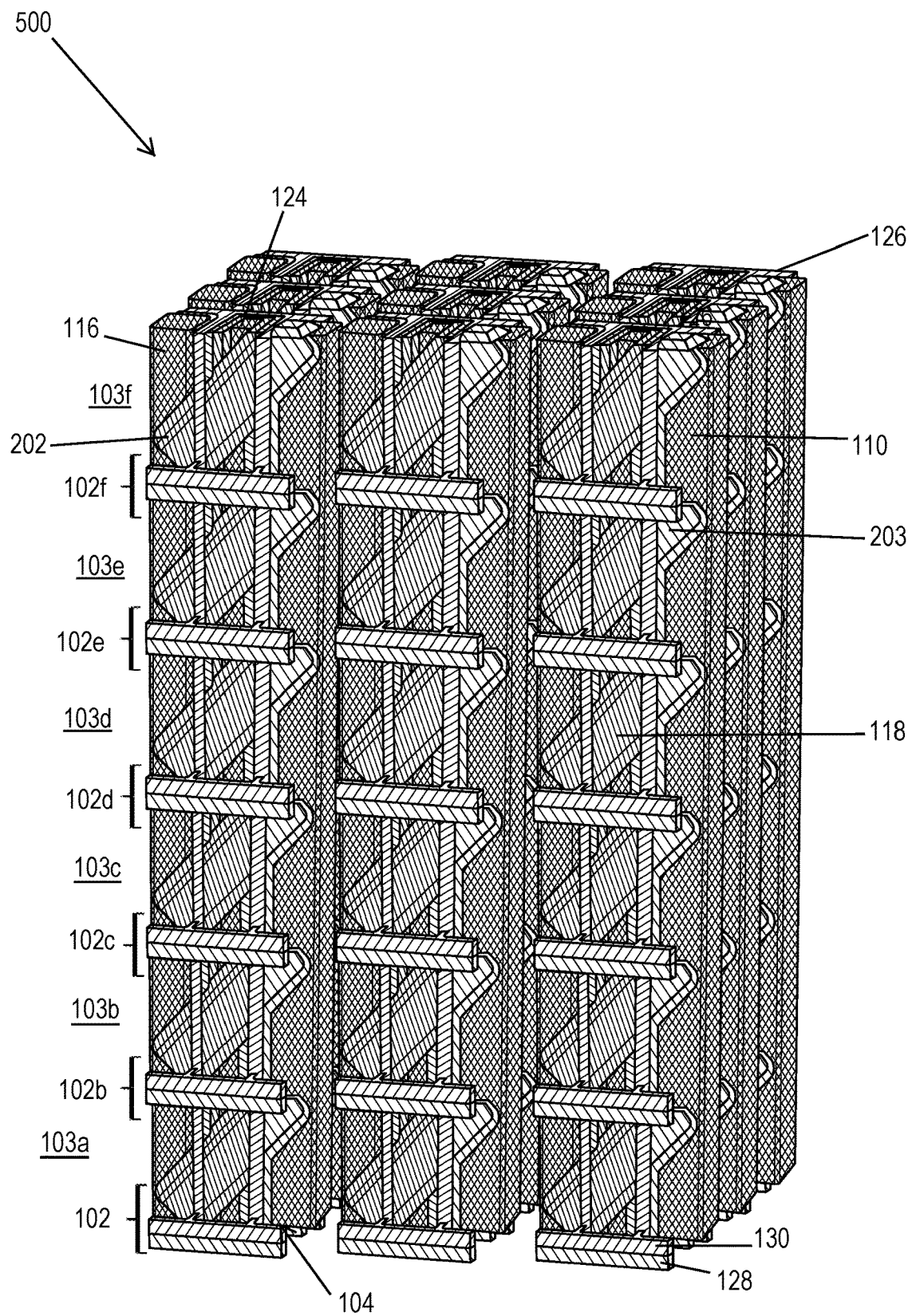
FIG. 31 illustrates a parallel projection view of a device according to one or more embodiments of the disclosure.

FIGS. 29-31 are front views depicting an electronic device according to one or more embodiments of the disclosure. With reference to FIG. 29, in one or more embodiments, a gate 124 is then deposited in the opening 123. The gate 124 encloses the angled channel 118 between the source region 106 and the drain region 112. The gate 124 can be made of any suitable material known to the skilled artisan. In one or more embodiments, the gate 124 comprises a metal selected from one or more of copper (Cu), cobalt (Co), tungsten (W), titanium (Ti), molybdenum (Mo), nickel (Ni), ruthenium (Ru), silver (Ag), gold (Au), iridium (Ir), or platinum (Pt). In one or more specific embodiments, the gate 124 comprises a metal selected from one or more of cobalt (Co), tungsten (W), titanium (Ti), molybdenum (Mo), nickel (Ni), ruthenium (Ru), silver (Ag), iridium (Ir), or platinum (Pt). In other specific embodiments, the gate 124 comprises a metal selected from one or more of cobalt (Co), tungsten (W), titanium (Ti), molybdenum (Mo), or ruthenium (Ru).

FIG. 30 is a parallel projection view of the electronic device of FIG. 29 (which is shown in cross-section). Referring to FIG. 30, the dielectric layer 126 surrounds the entire electronic device 100.

Referring to FIG. 31, the electronic device 100 can be stacked one on top of the other and one adjacent to the other to create a stackable angled logic (SAL) device 500. Without intending to be bound by theory, the stackable angled logic (SAL) device 500 can contain one or more tier 103. In one or more embodiments, multiple tiers 103 can be stacked on top of one another. With reference to FIG. 30, six tiers 103a, 103b, 103c, 103d, 103e, and 103f are shown stacked on top of one another. In such embodiments where multiple tiers 103 are stacked on top of one another, each of the angled channels 118 is electrically separated from an adjacent angled channel 118. With reference to FIG. 31, when six tiers 103a, 103b, 103c, 103d, 103e, and 103f are stacked on top of one another, each tier 103 has multiple angled channels 118 adjacent one another horizontally, which are then electrically separated from angled channels 118 above and/or below in another tier 103. As described above, the term "electrically separated" means that the flow of electrons through the angled channel(s) does not occur between one angled channel and an angled channel adjacent to it, horizontally adjacent or vertically adjacent.

In one or more embodiments, stackable angled logic (SAL) permits semiconductor designers to stack more channels, and the number of channels is adjusted according to the device manufactures needs. SAL can also be stacked for scaling purposes, especially when high-aspect-ratio etch and deposition processes become more mature. In one or more embodiments, designers stack the same channel layers and determine the NAND/SRAM/Logic/CPU/MPU/Capacitor based on CT and CH etched depth.

Without intending to be bound by theory, it is thought that the stackable angled logic (SAL) device of one or more embodiments doesn't need Fins cut or channels cut. Each of SAL's angled channel is already defined by channel etch angle, for given film depth, so no Fin/channel cut is necessary. Stackable angled logic also doesn't use gate cut; contact hole patterning with loose pitch will suffice. Furthermore, a high resolution scanner isn't needed for stackable angled logic channel and gate patterning. If, however, the semiconductor manufacturer wants to scale the channel and gate smaller, the semiconductor manufacturer can also opt for aggressive channel and gate patterning with litho-etch-litho-etch (LELE), litho-etch-litho-etch-litho-etch (LELELE), X-SADP, or even extreme ultra-violet (EUV).

Without intending to be bound by theory, the stackable angled logic device of one or more embodiments offers the possibility of direct wiring between contact to metal 0 (M0) and gate contact to metal 1 (M1). In one or more embodiments, the stackable angled logic device offers the possibility of direct wiring between higher metal layers, e.g. metal 2 (M2), metal 3, (M3), and the like. The stackable angled logic device doesn't need via-to-contact (VCT) for contact to metal0 (M0) wiring for power rail $V_{DD/SS}$ wirings. Additionally, stackable angled logic does not use via-to-gate contact (VCG) for gate contact to metal1 (M1) wiring. This will reduce scanner, on-product-overlay (OPO) requirements, and edge placement error (EPE) budget. In addition, the stackable angled logic device of one or more embodiments also offers lower contact resistance (better end-of-line electrical test (ET) and sort yield).

Furthermore, the stackable angled logic device of one or more embodiments offers the possibility of buried wordline metal 0 (M0) for $V_{DD/SS}$ power rail wiring. In one or more embodiments, different metals and barrier metals for these wirings, e.g. cobalt, molybdenum, ruthenium, tungsten, titanium, titanium nitride, and the like, are used for the purpose of improving the stackable angle logic device.

The stackable angled logic device of one or more embodiments, allows the metal gate and the contact gate to be merged as one single process, simplifying integration, processing variability, improving electrical test (ET) performance, and sort yield.

The stackable angled logic device of one or more embodiments enables integration of buried wordline metal 0 (M0) for $V_{DD/SS}$ power rail wirings. Metal 0 (M0), which are $V_{DD/SS}$ wirings, are buried below the angled channel 118 before formation of the angled channel 118. $V_{DD/SS}$ below the angled channel 118 reduces wordline capacitance. The stackable angled logic device of one or more embodiments allows metal 1 (M1) pitch to be increased from about 54 to about 80 nm, prolonging 193 nm wavelength immersion scanner (193i) usability. Metal 0 (M0) can be printed by self-aligned double patterning (SADP)/litho-etch-litho-etch (LELE) with the same 80 nm ½ pitch of ArF generated 193 nm wavelength immersion scanner (193i) resolution, using the same scanner illumination and reticle. In one or more embodiments, the buried $V_{DD/SS}$ allows for looser scanner requirements when scaling, reducing need of extreme ultraviolet (EUV). The stackable angle logic device of one or more embodiments eliminates the need of source/drain via-to-contact and via-to-gate contact by allowing M1 and M0 to directly connect with the gate and source/drain channels. The stackable angle logic device of one or more embodiments has less crowded middle-end-of-line (MEOL) or middle-of-line (MOL) and metal0 or metal1 (M0/M1) wirings.

The stackable angled logic device of one or more embodiments enables integration of in-between metal0 (M0) or in-between power rail $V_{DD/SS}$. Metal0 (M0), which are $V_{DD/SS}$, is formed in-between two stackable angled logic device stacks (e.g. top and below stack). The in-between M0 ($V_{DD/SS}$) connects top and below stackable angle logic device stacks' angled channel. In one or more embodiments, this allows more device scaling by stacking more stackable angle logic devices (i.e. a stack of transistors) on top of each other. Top and bottom M1 control top and bottom gate separately. The same in-between M0 can connect top and bottom stackable angled logic stacks. The in-between M0 for $V_{DD/SS}$ power rail has less crowded middle-end-of-line (MEOL) or middle-of-line (MOL) and metal0 or metal 1 (M0/M1) wirings. The in-between metal0 (M0) $V_{DD/SS}$ power railings lowers wordline capacitance. The in-between metal0 (M0) $V_{DD/SS}$ power rail allows a large number of stackable angled logic stacking, limited only by inter-metal (IM) layout, stress, and cost-of-ownership.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A transistor comprising:
a substrate having a top surface;
a source region having a source and a source contact, the source region on the top surface of the substrate;
a drain region having a drain and a drain contact, the drain region on the top surface of the substrate;
an angled channel located between the source and the drain and having an axis that is oriented at an angle relative to the top surface of the substrate in a range of greater than about 1° to less than about 90°;
a gate enclosing the angled channel between the source region and the drain region; and
a dielectric layer overlying and in contact with one or more of the gate, the source contact, or the drain contact.

2. The transistor of claim 1, wherein the angled channel comprises one or more of a semiconducting nanowire, a semiconducting nanosheet, or a gate all-around.

3. The transistor of claim 2, wherein the semiconducting nanowire or the semiconducting nanosheet is epitaxially grown.

4. The transistor of claim 1, wherein the axis of the angled channel is oriented relative to the top surface of the substrate at an angle in a range selected from the group consisting of about 10° to about 80°, about 20° to about 70°, and about 33° to about 67°.

5. The transistor of claim 1, further comprising a barrier layer between the gate and one or more of the source contact or the drain contact.

6. The transistor of claim 1, further comprising a gate oxide enclosing the angled channel.

7. The transistor of claim 1, further comprising a work-function metal between the angled channel and the gate.

8. The transistor of claim 1, wherein the substrate comprises one or more of silicon (Si), germanium (Ge), gallium (Ga), arsenic (As), indium (In), phosphorus (P), copper (Cu), or selenium (Se).

9. The transistor of claim 1, wherein the dielectric layer comprises a low-κ dielectric material with atoms of one or more of silicon, aluminum, carbon, oxygen, hydrogen, aluminum, or nitrogen.

10. The transistor of claim 1, wherein the substrate comprises a doped epitaxial layer and the top surface is laser treated.

11. The transistor of claim 1, wherein the angled channel has a length along the axis of about 69 nm.

12. An electronic device comprising a stack of transistors according to claim 1.

13. The electronic device of claim 12, wherein each angled channel is electrically separated from an adjacent angled channel.

14. A transistor comprising:
a substrate comprising a doped epitaxial layer having a laser treated top surface;
a source region having a source and a source contact, the source region on the top surface of the substrate;
a drain region having a drain and a drain contact, the drain region on the top surface of the substrate;

an angled channel comprising a semiconducting nanostructure located between the source and the drain and having an axis that is oriented at an angle to the top surface of the substrate at an angle in a range selected from the group consisting of about 1° to less than about 90°, about 10° to about 80°, about 20° to about 70°, and about 33° to about 67°;

a gate oxide on the angled channel;

at least one work-function metal on the gate oxide;

a gate metal on the work-function metal; and a dielectric layer overlying and in contact with one or more of the gate, the source contact or the drain contact.

* * * * *

UNITED STATES PATENT AND TRADEMARK OFFICE
CERTIFICATE OF CORRECTION

PATENT NO. : 10,629,752 B1  
APPLICATION NO. : 16/157337  
DATED : April 21, 2020  
INVENTOR(S) : Russell Chin Yee Teo et al.

Page 1 of 1

It is certified that error appears in the above-identified patent and that said Letters Patent is hereby corrected as shown below:

On the Title Page

Item (56), Column 2, under "OTHER PUBLICATIONS", Line 1, replace "Modeleng" with "Modeling".

Item (56), Column 2, under "OTHER PUBLICATIONS", Line 2, replace "Selecteve" with "Selective".

Signed and Sealed this  
Twenty-third Day of June, 2020

Andrei Iancu  
*Director of the United States Patent and Trademark Office*